US012580548B2

(12) United States Patent
Liu et al.

(10) Patent No.: US 12,580,548 B2
(45) Date of Patent: Mar. 17, 2026

(54) RAISED FRAME BULK ACOUSTIC WAVE DEVICES

(71) Applicant: Skyworks Global Pte. Ltd., Singapore (SG)

(72) Inventors: Jiansong Liu, Fremont, CA (US); Kwang Jae Shin, Yongin (KR); Yiliu Wang, Irvine, CA (US); Jong Duk Han, Yongin (KR); Jae Hyung Lee, Seoul (KR); Myung Hyun Park, Seongnam-si (KR)

(73) Assignee: Skyworks Global Pte. Ltd., Singapore (SG)

( * ) Notice: Subject to any disclaimer, the term of this patent is extended or adjusted under 35 U.S.C. 154(b) by 999 days.

(21) Appl. No.: 17/703,777

(22) Filed: Mar. 24, 2022

(65) Prior Publication Data

US 2022/0311411 A1 Sep. 29, 2022

Related U.S. Application Data

(60) Provisional application No. 63/166,096, filed on Mar. 25, 2021, provisional application No. 63/166,128, filed on Mar. 25, 2021.

(51) Int. Cl.
| | |
|---|---|
| *H03H 9/17* | (2006.01) |
| *H03H 9/05* | (2006.01) |
| *H03H 9/13* | (2006.01) |
| *H03H 9/56* | (2006.01) |

(52) U.S. Cl.
CPC ............ *H03H 9/17* (2013.01); *H03H 9/0504* (2013.01); *H03H 9/13* (2013.01); *H03H 9/568* (2013.01)

(58) Field of Classification Search
CPC ........... H03H 9/17; H03H 9/0504; H03H 9/13
See application file for complete search history.

(56) References Cited

U.S. PATENT DOCUMENTS

| | | | |
|---|---|---|---|
| 9,490,771 | B2 | 11/2016 | Burak et al. |
| 9,660,609 | B2 | 5/2017 | Reisner et al. |
| 10,250,228 | B2 | 4/2019 | Chang et al. |
| 10,886,888 | B2 | 1/2021 | Ivira et al. |
| 11,082,023 | B2 | 8/2021 | Shin et al. |
| 11,316,494 | B2 | 4/2022 | Liu et al. |
| 11,349,454 | B2 | 5/2022 | Shin et al. |
| 11,405,013 | B2 | 8/2022 | Shin et al. |
| 11,581,869 | B2 | 2/2023 | Shin et al. |
| 11,595,018 | B2 | 2/2023 | Liu et al. |

(Continued)

FOREIGN PATENT DOCUMENTS

WO WO 2020/199505 10/2020

*Primary Examiner* — Bryan P Gordon
(74) *Attorney, Agent, or Firm* — Knobbe, Martens, Olson & Bear, LLP

(57) ABSTRACT

Aspects of this disclosure relate to bulk acoustic wave devices that have a raised frame structure. The raised frame structure can include a first raised frame layer that has a relatively low acoustic impedance. The raised frame structure can include a second raised frame layer that has a relatively high acoustic impedance. The first raised frame layer can have a thickness that is between about 0.02 and about 0.4 times the combined thickness H of the bulk acoustic wave device. The first raised frame layer can have a thickness that is between about 0.01 and about 0.2 times the resonant wavelength λ of the bulk acoustic wave device.

24 Claims, 11 Drawing Sheets

(56) References Cited

U.S. PATENT DOCUMENTS

| | | | |
|---|---|---|---|
| 11,601,112 B2 | 3/2023 | Wang et al. | |
| 11,601,113 B2 | 3/2023 | Wang et al. | |
| 11,671,074 B2 | 6/2023 | Matsuo et al. | |
| 11,764,750 B2 | 9/2023 | Hou et al. | |
| 12,028,041 B2 | 7/2024 | Liu et al. | |
| 12,101,077 B2 | 9/2024 | Zhang et al. | |
| 12,176,883 B2 | 12/2024 | Wang et al. | |
| 12,244,297 B2 | 3/2025 | Komatsu et al. | |
| 12,255,624 B2 | 3/2025 | Wang et al. | |
| 12,267,065 B2 | 4/2025 | Liu et al. | |
| 12,273,090 B2 | 4/2025 | Wang et al. | |
| 12,278,619 B2 | 4/2025 | Wang et al. | |
| 12,375,054 B2 | 7/2025 | Shirakawa et al. | |
| 2011/0298564 A1 | 12/2011 | Iwashita et al. | |
| 2015/0280687 A1 | 10/2015 | Burak et al. | |
| 2016/0126930 A1* | 5/2016 | Zou | H10N 30/87 |
| | | | 333/187 |
| 2016/0163954 A1 | 6/2016 | Shin et al. | |
| 2016/0227603 A1 | 8/2016 | Huang et al. | |
| 2016/0352308 A1* | 12/2016 | Ivira | H03H 9/175 |
| 2017/0244021 A1 | 8/2017 | Han et al. | |
| 2019/0182894 A1 | 6/2019 | Huang et al. | |
| 2020/0099359 A1* | 3/2020 | Shin | H03H 9/0561 |
| 2020/0274515 A1 | 8/2020 | Shin et al. | |
| 2020/0373901 A1 | 11/2020 | Liu et al. | |
| 2020/0373911 A1 | 11/2020 | Wang et al. | |
| 2020/0395911 A1 | 12/2020 | Liu et al. | |
| 2021/0028751 A1* | 1/2021 | Hurwitz | H03H 9/1014 |
| 2021/0028765 A1 | 1/2021 | Wang et al. | |
| 2021/0083643 A1 | 3/2021 | Liu et al. | |
| 2021/0111692 A1 | 4/2021 | Liu et al. | |
| 2021/0126619 A1 | 4/2021 | Wang et al. | |
| 2021/0126625 A1 | 4/2021 | Wang et al. | |
| 2021/0344321 A1 | 11/2021 | Shin et al. | |
| 2022/0094323 A1 | 3/2022 | Zhang et al. | |
| 2022/0094324 A1 | 3/2022 | Zhang et al. | |
| 2022/0094335 A1 | 3/2022 | Zhang et al. | |
| 2022/0103150 A1 | 3/2022 | Shin et al. | |
| 2022/0103151 A1 | 3/2022 | Shin et al. | |
| 2022/0103152 A1 | 3/2022 | Shin et al. | |
| 2022/0103159 A1 | 3/2022 | Shin et al. | |
| 2022/0200571 A1 | 6/2022 | Wang et al. | |
| 2022/0200572 A1 | 6/2022 | Wang et al. | |
| 2022/0209743 A1 | 6/2022 | Liu et al. | |
| 2022/0209747 A1 | 6/2022 | Wang et al. | |
| 2022/0209749 A1 | 6/2022 | Wang et al. | |
| 2022/0311410 A1 | 9/2022 | Komatsu et al. | |
| 2022/0311411 A1 | 9/2022 | Liu et al. | |
| 2022/0311412 A1 | 9/2022 | Liu et al. | |
| 2022/0311419 A1 | 9/2022 | Komatsu et al. | |
| 2022/0321080 A1 | 10/2022 | Shirakawa et al. | |
| 2022/0368312 A1 | 11/2022 | Wang et al. | |
| 2023/0105560 A1 | 4/2023 | Shin et al. | |
| 2023/0106034 A1 | 4/2023 | Shin et al. | |

* cited by examiner

FRAME ZONE

PIEZOELECTRIC LAYER

METAL

A ——————————————————————————————— A'

100

THICKNESS=0λ

THICKNESS=0.01λ

THICKNESS=0.02λ

THICKNESS=0.03λ

THICKNESS=0.04λ

THICKNESS=0.045λ

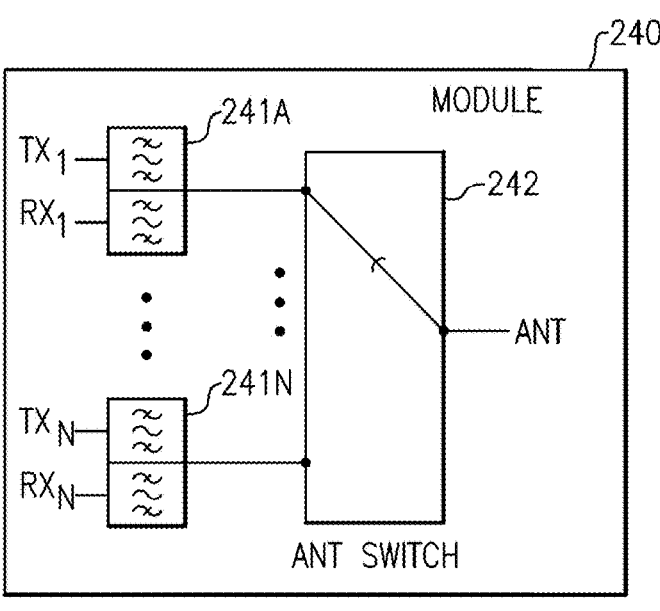
FIG.12
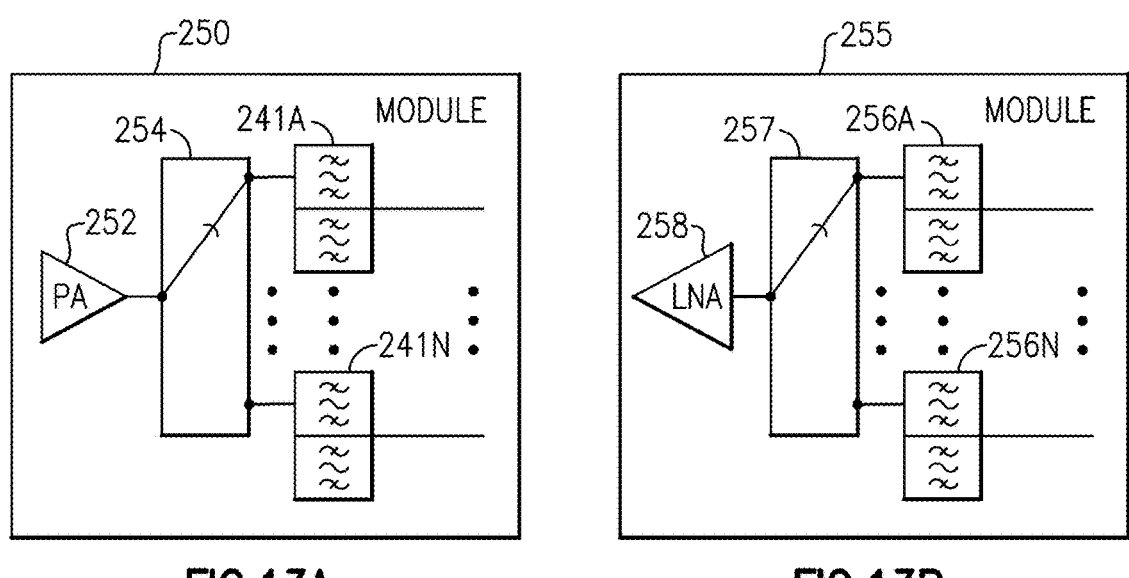
FIG.13A          FIG.13B
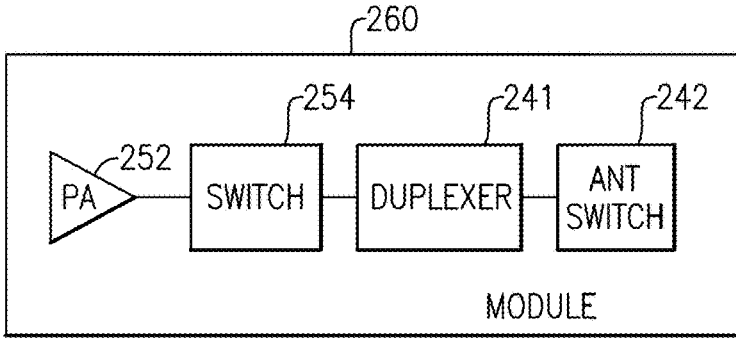
FIG.14

RAISED FRAME BULK ACOUSTIC WAVE DEVICES

CROSS REFERENCE TO PRIORITY APPLICATIONS

This application claims the benefit of priority U.S. Provisional Patent Application No. 63/166,096, filed Mar. 25, 2021 and titled "RAISED FRAME BULK ACOUSTIC WAVE DEVICES," and also claims the benefit of priority U.S. Provisional Patent Application No. 63/166,128, filed Mar. 25, 2021 and titled "BULK ACOUSTIC WAVE DEVICES WITH TUNED ACOUSTIC IMPEDANCE," the contents of each of which are hereby incorporated by reference in their entireties herein.

BACKGROUND

Field of the Disclosure

Some embodiments disclosed herein relate to acoustic wave devices, such as bulk acoustic wave devices, and to filters that include bulk acoustic wave devices.

Description of the Related Technology

Acoustic wave filters can be implemented in radio frequency electronic systems. For example, filters in a radio frequency front end of a mobile phone can include one or more acoustic wave filters. A plurality of acoustic wave filters can be arranged as a multiplexer. For instance, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. BAW filters can include BAW resonators. In BAW resonators, acoustic waves propagate in a bulk of a piezoelectric layer. Example BAW resonators include film bulk acoustic wave resonators (FBARs) and solidly mounted resonators (SMRs).

Although various BAW devices exist, there remains a need for improved BAW devices and filters.

SUMMARY OF CERTAIN ASPECTS

Certain example aspects are summarized below for illustrative purposes. The innovations are not limited to the specific implementations recited herein. The innovations described herein can have several novel aspects, no single one of which is solely responsible for its desirable attributes or essential.

Various embodiments disclosed herein can relate to a bulk acoustic wave device, which can include a first electrode, a second electrode, and a piezoelectric layer between the first electrode and the second electrode. The first electrode, the second electrode, and the piezoelectric layer can have a combined thickness H. A raised frame structure can include a first raised frame layer and a second raised frame layer. The first raised frame layer can have a thickness between about 0.02 to about 0.4 times the combined thickness H. The second raised frame layer can have a higher acoustic impedance than the first raised frame layer. The thickness of the first raised frame layer can be between about 0.04 to about 0.2 times the combined thickness H. The thickness of the first raised frame layer can be between about 0.06 to about 0.14 times the combined thickness H. The thickness of the first raised frame layer can be between about 0.08 to about 0.1 times the combined thickness H. The thickness of the first raised frame layer can be about 0.09 times the combined thickness H.

The combined thickness H can be at a main acoustically active region of the bulk acoustic device. The bulk acoustic wave device can include an active region where the first electrode overlaps the second electrode. The active region can include a middle area, and the raised frame structure can be positioned outside the middle area of the active region. The combined thickness H can be at the middle area of the active region. The bulk acoustic wave device can include a recessed frame region between the raised frame structure and the middle area. The bulk acoustic wave device can include a passivation layer over the first electrode, the second electrode, the piezoelectric layer, and/or the raised frame structure. The passivation layer can be thinner at the recessed frame region than at the middle area.

The second raised frame layer can at least partially overlap the first raised frame layer. The first raised frame layer can be between the first electrode and the second electrode. The piezoelectric layer can be over the first electrode, the second electrode can be over the piezoelectric layer, and the first raised frame layer can be between the second electrode and the piezoelectric layer. The second raised frame layer can be over the second electrode. The piezoelectric layer can be over the first electrode, the second electrode can be over the piezoelectric layer, and the first raised frame layer can be between the first electrode and the piezoelectric layer. The second raised frame layer can be over the second electrode.

The first raised frame layer can have a lower acoustic impedance than the first electrode. The first raised frame layer can have a lower acoustic impedance than the second electrode. The first raised frame layer can have a lower acoustic impedance than the piezoelectric layer. The first raised frame layer can include silicon dioxide. The second raised frame layer can include the same material as the second electrode. The second raised frame layer can include at least one of molybdenum, tungsten, ruthenium, platinum, or iridium.

The bulk acoustic wave device can include a cavity, and the first electrode can be between the cavity and the piezoelectric layer. The bulk acoustic wave device can include an acoustic Bragg reflector, and the first electrode can be between the acoustic Bragg reflector and the piezoelectric layer.

Various embodiments disclosed herein can relate to a bulk acoustic wave device, which can include a first electrode, a second electrode, a piezoelectric layer between the first electrode and the second electrode. The first electrode, the second electrode, and the piezoelectric layer can have a combined thickness H. A raised frame structure can include a raised frame layer having a lower acoustic impedance than at least one of the first electrode, the second electrode, and the piezoelectric layer. The first raised frame layer can have a thickness between about 0.02 to about 0.4 times the combined thickness H. The thickness of the first raised frame layer can be between about 0.04 to about 0.2 times the combined thickness H. The thickness of the first raised frame layer can be between about 0.06 to about 0.14 times the combined thickness H. The thickness of the first raised frame layer can be between about 0.08 to about 0.1 times the combined thickness H. The thickness of the first raised frame layer can be about 0.09 times the combined thickness H. The combined thickness H can be at a main acoustically active region of the bulk acoustic device.

The bulk acoustic wave device can include an active region where the first electrode overlaps the second electrode. The active region can include a middle area, and the raised frame structure can be positioned outside the middle area of the active region. The combined thickness H can be at the middle area of the active region. The bulk acoustic wave device can include a recessed frame region between the raised frame structure and the middle area. The bulk acoustic wave device can include a passivation layer over the first electrode, the second electrode, the piezoelectric layer, and/or the raised frame structure. The passivation layer can be thinner at the recessed frame region than at the middle area.

The raised frame layer can be between the first electrode and the second electrode. The piezoelectric layer can be over the first electrode, the second electrode can be over the piezoelectric layer, and the raised frame layer can be between the second electrode and the piezoelectric layer. The piezoelectric layer can be over the first electrode, the second electrode can be over the piezoelectric layer, and the raised frame layer can be between the first electrode and the piezoelectric layer.

The raised frame layer can have a lower acoustic impedance than the first electrode. The raised frame layer can have a lower acoustic impedance than the second electrode. The raised frame layer can have a lower acoustic impedance than the piezoelectric layer. The raised frame layer can include silicon dioxide.

The bulk acoustic wave device can include a cavity, and the first electrode can be between the cavity and the piezoelectric layer. The bulk acoustic wave device can include an acoustic Bragg reflector, and the first electrode can be between the acoustic Bragg reflector and the piezoelectric layer.

The raised frame structure can include an additional raised frame layer that has higher acoustic impedance than the raised frame layer. The second raised frame layer can at least partially overlap the first raised frame layer. The second raised frame layer can include the same material as the second electrode. The second raised frame layer can include at least one of molybdenum, tungsten, ruthenium, platinum, or iridium.

Various embodiments disclosed herein can relate to a bulk acoustic wave device that includes a first electrode, a second electrode, and a piezoelectric layer between the first electrode and the second electrode. The bulk acoustic wave device can be configured to have a main resonant frequency for an acoustic wave having a resonant wavelength λ. A raised frame structure can including a first raised frame layer and a second raised frame layer. The second raised frame layer can have a higher acoustic impedance than the first raised frame layer. The first raised frame layer can have a thickness between about 0.01 to about 0.2 times the resonant wavelength λ. The thickness of the first raised frame layer can be between about 0.02 to about 0.1 times the resonant wavelength λ. The thickness of the first raised frame layer can be between about 0.03 to about 0.07 times the resonant wavelength λ. The thickness of the first raised frame layer can be between about 0.04 to about 0.05 times the resonant wavelength λ. The thickness of the first raised frame layer can be about 0.045 times the resonant wavelength λ.

The first electrode, the second electrode, and the piezoelectric layer can have a combined thickness H. The resonant wavelength λ can be about 2 times the combined thickness H. The combined thickness H can be at a main acoustically active region of the bulk acoustic device. The bulk acoustic wave device can have an active region where the first electrode overlaps the second electrode. The active region can include a middle area, and the raised frame structure can be positioned outside the middle area of the active region. The bulk acoustic wave device can include a recessed frame region between the raised frame structure and the middle area. The bulk acoustic wave device can include a passivation layer over the first electrode, the second electrode, the piezoelectric layer, and/or the raised frame structure. The passivation layer can be thinner at the recessed frame region than at the middle area.

The second raised frame layer can at least partially overlaps the first raised frame layer. The first raised frame layer can be between the first electrode and the second electrode. The piezoelectric layer can be over the first electrode, the second electrode can be over the piezoelectric layer, and the first raised frame layer can be between the second electrode and the piezoelectric layer. The second raised frame layer can be over the second electrode. The piezoelectric layer can be over the first electrode, the second electrode can be over the piezoelectric layer, and the first raised frame layer can be between the first electrode and the piezoelectric layer. The second raised frame layer can be over the second electrode.

The first raised frame layer can have a lower acoustic impedance than the first electrode. The first raised frame layer can have a lower acoustic impedance than the second electrode. The first raised frame layer can have a lower acoustic impedance than the piezoelectric layer. The first raised frame layer can include silicon dioxide. The second raised frame layer can include the same material as the second electrode. The second raised frame layer includes at least one of molybdenum, tungsten, ruthenium, platinum, or iridium.

The bulk acoustic wave device can include a cavity, and the first electrode can be between the cavity and the piezoelectric layer. The bulk acoustic wave device can include an acoustic Bragg reflector, and the first electrode can be between the acoustic Bragg reflector and the piezoelectric layer.

Various embodiments disclosed herein can relate to a bulk acoustic wave device, which can include a first electrode, a second electrode, and a piezoelectric layer between the first electrode and the second electrode. The bulk acoustic wave device can be configured to have a main resonant frequency for an acoustic wave having a resonant wavelength λ. A raised frame structure can including a raised frame layer having a lower acoustic impedance than at least one of the first electrode, the second electrode, and the piezoelectric layer. The raised frame layer can have a thickness between about 0.01 to about 0.2 times the resonant wavelength λ. The thickness of the raised frame layer can be between about 0.02 to about 0.1 times the resonant wavelength λ. The thickness of the raised frame layer can be between about 0.03 to about 0.07 times the resonant wavelength λ. The thickness of the raised frame layer can be between about 0.04 to about 0.05 times the resonant wavelength λ. The thickness of the raised frame layer can be about 0.045 times the resonant wavelength λ.

The first electrode, the second electrode, and the piezoelectric layer can have a combined thickness H, and the resonant wavelength λ can be about 2 times the combined thickness H. The bulk acoustic wave device can have an active region where the first electrode overlaps the second electrode. The active region can include a middle area, and the raised frame structure can be positioned outside the middle area of the active region. The bulk acoustic wave device can have a recessed frame region between the raised frame structure and the middle area. The bulk acoustic wave device can have a passivation layer over the first electrode, the second electrode, the piezoelectric layer, and/or the raised frame structure, the passivation layer thinner at the recessed frame region than at the middle area.

The raised frame layer can be between the first electrode and the second electrode. The piezoelectric layer can be over the first electrode, the second electrode can be over the piezoelectric layer, and the raised frame layer can be between the second electrode and the piezoelectric layer. The piezoelectric layer can be over the first electrode, the second electrode can be over the piezoelectric layer, and the raised frame layer can be between the first electrode and the piezoelectric layer.

The raised frame layer can have a lower acoustic impedance than the first electrode. The raised frame layer can have a lower acoustic impedance than the second electrode. The raised frame layer can have a lower acoustic impedance than the piezoelectric layer. The raised frame layer includes silicon dioxide.

The bulk acoustic wave device can include a cavity, and the first electrode can be between the cavity and the piezoelectric layer. The bulk acoustic wave device can include an acoustic Bragg reflector, and the first electrode can be between the acoustic Bragg reflector and the piezoelectric layer.

The raised frame structure can include an additional raised frame layer that can have a higher acoustic impedance than the raised frame layer. The second raised frame layer can at least partially overlap the first raised frame layer. The second raised frame layer can include the same material as the second electrode. The second raised frame layer can include at least one of molybdenum, tungsten, ruthenium, platinum, or iridium.

A band pass filter can include one or more of the bulk acoustic wave devices disclosed herein. A band stop filter can include one or more of the bulk acoustic wave devices disclosed herein. A ladder filter can include one or more of the bulk acoustic wave devices disclosed herein. A lattice filter can include one or more of the bulk acoustic wave devices disclosed herein. A diplexer can include at least one filter that includes one or more of the bulk acoustic wave devices disclosed herein. A duplexer can include at least one filter that includes one or more of the bulk acoustic wave devices disclosed herein. A multiplexer can include at least one filter that includes one or more of the bulk acoustic wave devices disclosed herein. A switching multiplexer can include at least one filter that includes one or more of the bulk acoustic wave devices disclosed herein.

A radio frequency module can include an acoustic wave die that has at least one filter. The at least one filter can include one or more of the bulk acoustic wave devices disclosed herein. The radio frequency module can have a radio frequency circuit element coupled to the acoustic wave die. The acoustic wave die and the radio frequency circuit element can be enclosed within a common module package.

A wireless communication device can include an acoustic wave filter that has one or more of the bulk acoustic wave devices disclosed herein. The wireless communication device can have an antenna operatively coupled to the acoustic wave filter, a radio frequency amplifier operatively coupled to the acoustic wave filter and configured to amplify a radio frequency signal, and a transceiver in communication with the radio frequency amplifier. The wireless communication device can include a baseband processor in communication with the transceiver. The acoustic wave filter can be included in a radio frequency front end. The wireless communication device can be a user equipment.

A wireless communication device can include an acoustic wave die that has at least one filter. The at least one filter can include one or more of the bulk acoustic wave devices disclosed herein. The wireless communication device can include an antenna, which can be operatively coupled to an acoustic wave filter, a radio frequency amplifier operatively coupled to the acoustic wave filter and configured to amplify a radio frequency signal, and a transceiver in communication with the radio frequency amplifier. The wireless communication device can include a baseband processor in communication with the transceiver. The acoustic wave filter can be included in a radio frequency front end. The wireless communication device can be a user equipment.

BRIEF DESCRIPTION OF THE DRAWINGS

Embodiments of this disclosure will now be described, by way of non-limiting example, with reference to the accompanying drawings, like reference numerals can refer to similar features throughout.

FIG. 12 is a schematic block diagram of a module that includes an antenna switch and duplexers that include one or more raised frame bulk acoustic wave devices.

FIG. 13A is a schematic block diagram of a module that includes a power amplifier, a radio frequency switch, and duplexers that include one or more raised frame bulk acoustic wave devices.

FIG. 13B is a schematic block diagram of a module that includes a low noise amplifier, a radio frequency switch, and acoustic wave filters t include one or more raised frame bulk acoustic wave devices.

FIG. 14 is a schematic block diagram of a module that includes a power amplifier, a radio frequency switch, a duplexer that includes one or more raised frame bulk acoustic wave devices.

Figure 1:
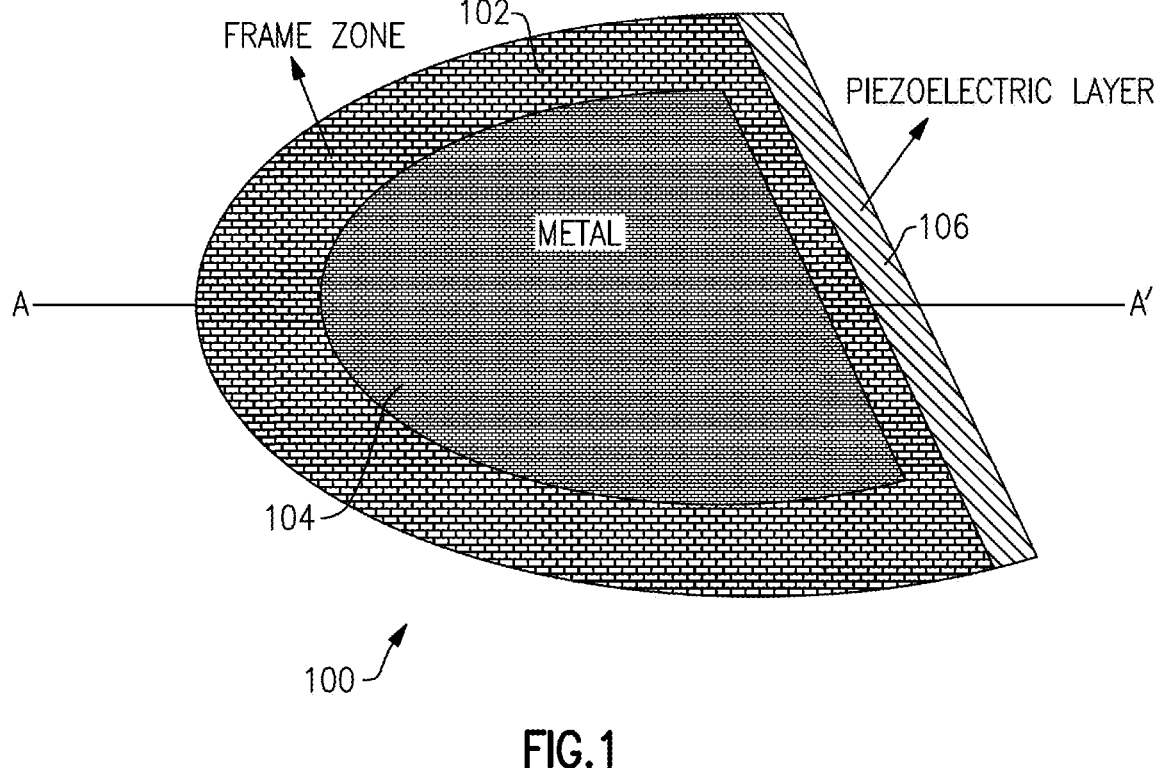
FIG. 1 is a plan view of an example embodiment of a raised frame bulk acoustic wave device.

DETAILED DESCRIPTION OF CERTAIN
EMBODIMENTS

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

For developing high performance bulk acoustic wave (BAW) filters, a high quality factor (Q) can be generally desirable. Bulk acoustic wave (BAW) devices can include raised frame structures. A raised frame structure can reduce lateral energy leakage from a main acoustically active region of the bulk acoustic wave device. A BAW device can include a single-layer raised frame structure, in some implementations. A BAW device can include a multi-layer raised frame structure, in some implementations, which can facilitate achieving a relatively high Q, such as in a region above a resonant frequency and an anti-resonant frequency. A BAW device can include a layer that includes a material with a relatively low acoustic impedance (e.g., lower than one or both of the electrodes), which can have a thickness selected to provide a high Q. BAW devices with the raised frame structures disclosed herein can achieve low insertion loss and/or low Gamma loss, in some cases.

To achieve a high Q, a raised frame, which can be referred to as a border ring, can block lateral energy leakage from an active domain of a BAW resonator to a passive domain of the BAW resonator. A raised frame can improve Q, although it may not be able to trap all leakage energy. In some instances, the raised frame can generate a relatively large spurious mode, which can be referred to as a raised frame mode, which can be below a main resonant frequency of a BAW resonator. This can cause Gamma degradation in carrier aggregation bands for a filter. Gamma can refer to a reflection coefficient. A low Gamma loss can be achieved with a raised frame spurious mode away from carrier aggregation bands.

Some aspects of this disclosure relate to a bulk acoustic wave resonator that includes a raised frame structure that can achieve low insertion loss and/or low Gamma loss. The raised frame structure can be disposed outside or along a perimeter of an active region of the bulk acoustic wave resonator. The raised frame can include a material with relatively low acoustic impedance, which can be configured to provide low insertion loss and/or low Gamma loss. In some implementations, the multi-layer raised frame structure can include a first raised frame layer and a second raised frame layer. The first raised frame layer can include a relatively low acoustic impedance material, such as silicon dioxide, disposed between electrodes that are on opposing sides of a piezoelectric layer. For instance, the low acoustic impedance material can be disposed between a top electrode and a piezoelectric layer of a bulk acoustic wave resonator. The second raised frame layer can include a relatively high acoustic impedance material. The second raised frame layer can include a material this is heavier or more dense than the material of the first raised frame layer. In some cases, the second raised frame layer can be the same material as an electrode of the bulk acoustic wave resonator.

Due to the low acoustic impedance material, the frequency of the raised frame domain generating a relatively strong raised frame spurious mode can be significantly lower than for other types of BAW devices. The low acoustic impedance material can be configured so that the raised frame mode for the raised frame structure can be outside of a carrier aggregation band so as not to provide a Gamma loss, or to provide low Gamma loss, in some cases. By way of example, in a carrier aggregation application, a multiplexer can include a common node arranged to receive a carrier aggregation signal, a first filter having a passband associated with a first carrier of the carrier aggregation signal, and a second filter coupled to the first filter at the common node and having a second passband associated with a second carrier of the carrier aggregation signal. The first filter can include a BAW resonator with a raised frame structure with material having a low acoustic impedance as disclosed herein, which can increase Gamma for the first filter in the passband of the second filter.

Also, some raised frame structures disclosed herein can have a low acoustic impedance material configured so that the difference between the effective acoustic impedance of the raised frame domain and the active domain can provide a high Q. In some embodiments, the raised frame structure can provide a high mode reflection of a lateral energy and can decrease mode conversion from main mode to other lateral modes around the anti-resonance frequency. Accordingly, the configuration of a low acoustic impedance layer or material in the raised frame structure can cause Q to be significantly increased, such as relative to other BAW devices or other raised frame structure.

Although some embodiments disclosed herein may be discussed with reference to dual raised frame structures with two raised frame layers, various suitable principles and advantages discussed herein can be applied to a single-layer raised frame structures or multi-layer raised frame structure that includes two or three or more raised frame layers.

FIG. 1 is a plan view of a raised frame bulk acoustic wave device 100. As shown in FIG. 1, the bulk acoustic wave device 100 can include a raised frame zone 102 around the perimeter of an active region of the bulk acoustic wave device 100. The raised frame zone 102 can be referred to as a border ring in certain instances. A raised frame structure can be in the raised frame zone 102. The raised frame structure can be implemented in accordance with any suitable principles and advantages of the raised frame bulk acoustic wave devices disclosed herein. The raised frame structure can be outside of a middle area 104 of the active region of the bulk acoustic wave device 100. A raised frame layer can be in the raised frame zone 102 and can extend above a metal electrode. FIG. 1 illustrates the metal electrode at the middle area 104 and the raised frame layer at the raised frame zone 102. One or more other layers can be included over the metal electrode and the raised frame layer. For instance, silicon dioxide can be included over the metal electrode and the raised frame layer. FIG. 1 also illustrates that a piezoelectric layer 106 of the bulk acoustic wave device 100 can be below the metal electrode and the raised frame layer.

Some embodiments of raised frame bulk acoustic wave devices will be discussed with reference to example cross sections along the line from A to A' in FIG. 1. Any suitable combination of features of the bulk acoustic wave devices disclosed herein can be combined with each other. Any of the bulk acoustic wave devices disclosed herein can be a bulk acoustic wave resonator in a filter, such as arranged to filter a radio frequency signal.

Figure 2:
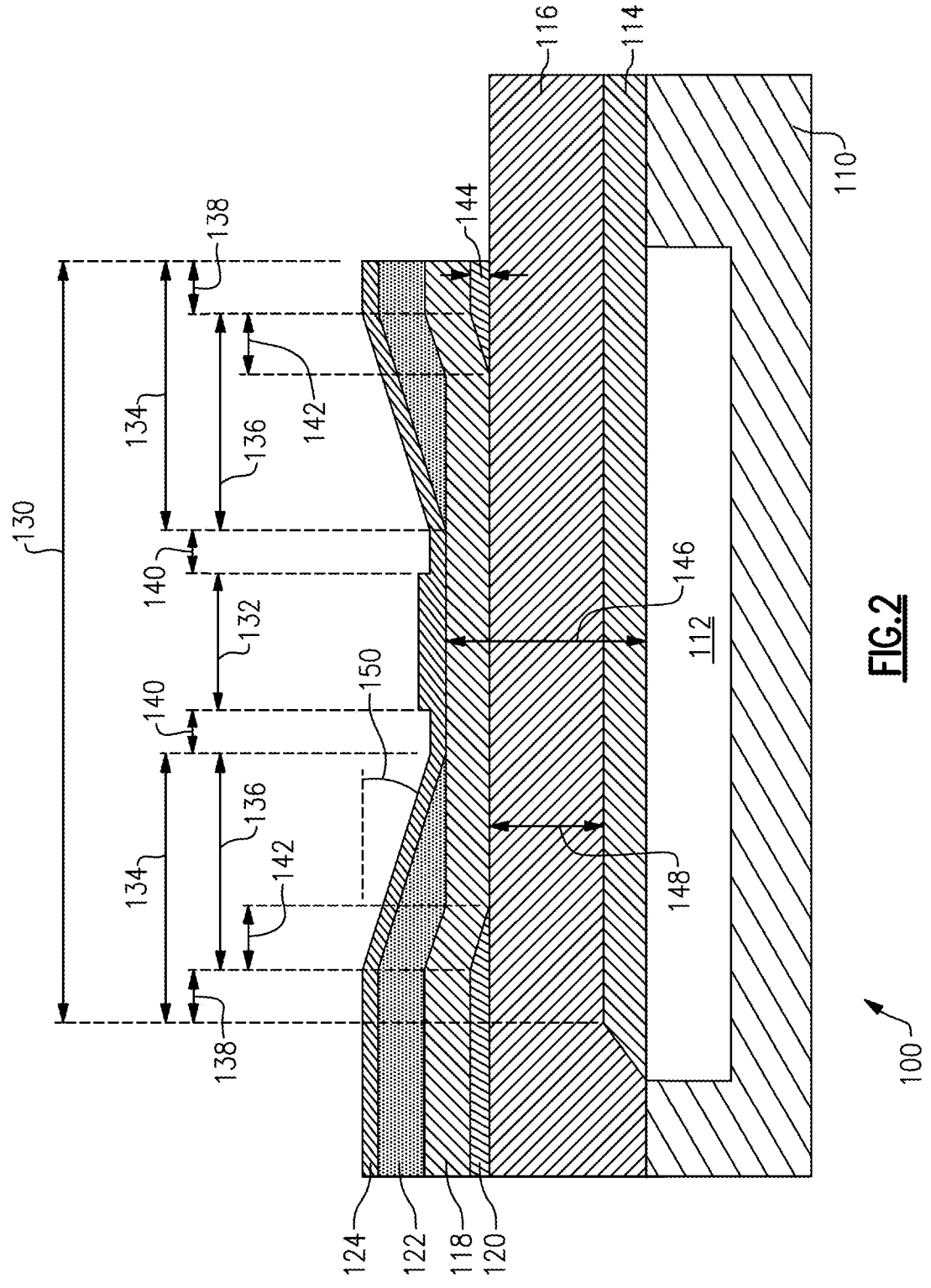
FIG. 2 is a cross-sectional view of an example embodiment of a raised frame bulk acoustic wave device.

FIG. 2 is a schematic cross-sectional view of an example embodiment of a bulk acoustic wave (BAW) device 100 with a dual-layer raised frame structure. The BAW device 100 can includes a support substrate 110, a cavity 112, a first or lower electrode 114 positioned over the support substrate 110, a piezoelectric layer 116 positioned over the lower electrode 114, a second or upper electrode 118 positioned over the piezoelectric layer 116, a first raised frame structure or layer 120 positioned at least partially between the piezoelectric layer 116 and the upper electrode 118, a second raised frame structure or layer 122 positioned over the upper electrode 118, and a passivation layer 124 positioned over the second raised frame structure 122.

The support substrate 110 can be a silicon substrate, and other suitable substrates can alternatively be implemented in place of the silicon substrate. One or more layers, such as a passivation layer, can be positioned between the lower electrode 114 and the support substrate 110. In some embodiments, the cavity 112 can be an air cavity.

The piezoelectric layer 116 can be disposed between the first electrode 114 and the second electrode 118. The piezoelectric layer 116 can be an aluminum nitride (AlN) layer or any other suitable piezoelectric layer. An active region 130 or active domain of the BAW device 100 can be defined by the portion of the piezoelectric layer 116 that overlaps with both the lower electrode 114 and the upper electrode 118, for example over an acoustic reflector, such as the cavity 112. The lower electrode 114 and/or the upper electrode 118 can have a relatively high acoustic impedance. For example, the lower electrode 114 and/or the upper electrode 118 can include molybdenum (Mo), tungsten (W), ruthenium (Ru), iridium (Jr), platinum (Pt), Ir/Pt, or any suitable alloy and/or combination thereof, although other suitable conductive materials could be used. The upper electrode 118 can be formed of the same material as the lower electrode 114 in certain instances, although different materials can be used for the lower electrode 114 and the upper electrode 118, in some cases.

The illustrated BAW device 100 can include an active region 130 that has a main acoustically active region 132 and a raised frame region 134 at least partially, or fully, surrounding the main acoustically active region 132 (e.g., in plan view). In the cross-sectional view of FIG. 2, the raised frame region 134 can be on opposing sides of the main acoustically active region 132. The main acoustically active region 132 may be referred to as a center region or middle area of the active region 130. The main acoustically active region 132 can set the main resonant frequency of the BAW device 100. There can be a significant (e.g., exponential) fall off of acoustic energy in the piezoelectric layer 116 for a main mode in the frame region 134 relative to the main acoustically active region 132. In the frame region 134, there can be a gradient region 136 and a non-gradient region 138. A recessed frame region 140 can be positioned between the main acoustically active region 132 and the raised frame region 134.

The dual-layer raised frame structure of the BAW device 100 can include the first raised frame structure or layer 120 and the second raised frame structure or layer 122. The first raised frame layer 120 and the second raised frame layer 122 can at least partially overlap with each other in the active region 130 of the BAW device 100. A raised frame region 134 or domain of the BAW device 100 can be defined by the portion of dual raised frame structure in the active region 130 of the BAW 100. At least a portion of the dual raised frame structure can be included in an active region 130 of the BAW device 100. In some cases, the dual raised frame structure can provide a high Q due to highly efficient reflection of lateral energy.

The first raised frame layer 120 can be positioned between the first or lower electrode 114 and the second or upper electrode 118. As illustrated in FIG. 2, the first raised frame layer 120 can be positioned between the piezoelectric layer 116 and the second electrode 118. The first raised frame layer 120 can extend beyond the active region of the bulk acoustic wave device 100 as shown in FIG. 2, which can be beneficial for manufacturability reasons in certain instances. The first raised frame layer 120 can have a non-gradient portion (e.g., in the non-gradient region 138) and a gradient portion (e.g., in the gradient region 136). The non-gradient portion of the first raised frame layer 120 can be substantially parallel to the piezoelectric layer 116 (e.g., to the upper surface thereof), such as in the non-gradient region 138. The non-gradient portion of the first raised frame layer 120 can have a substantially uniform thickness. The gradient portion of the first raised frame layer 120 can be angled downward and/or tapered, for example, and the upper surface of the gradient portion of the first raised frame layer 120 can form an angle 150 relative to upper surface of the non-gradient portion of the first raised frame layer 120. The first raised frame layer 120 can have a decreasing thickness moving along a direction from the raised frame structure toward the main acoustically active region 132 (or middle area). The gradient portion of the first raised frame layer 120 can have a length that extends into at least part of the gradient region 136.

The first raised frame layer 120 can be a low acoustic impedance material. The low acoustic impedance material can have a lower acoustic impedance than the material of the first electrode 114. The low acoustic impedance material has a lower acoustic impedance than the material of the second electrode 118. The low acoustic impedance material can have a lower acoustic impedance than the material of the piezoelectric layer 116. As an example, the first raised frame layer 120 can be a silicon dioxide (SiO2) layer. Since silicon dioxide is already used in a variety of bulk acoustic wave devices, a silicon dioxide first raised frame layer 120 can be relatively easy to manufacture. Other oxide materials can be used, and the first raised frame structure or layer 120 can be an oxide raised frame structure or layer. The first raised frame layer 120 can be a silicon nitride (SiN) layer, a silicon carbide (SiC) layer, or any other suitable low acoustic impedance layer. The first raised frame layer 120 can have a relatively low density. The density and/or acoustic impedance of the first raised frame layer 120 can be lower than the density and/or acoustic impedance of the lower electrode 114, of the upper electrode 118, of the piezoelectric layer 116, and/or of the second raised frame layer 122 of the BAW device 100.

In some cases, the first raised frame structure or layer 120 can reduce an effective electromechanical coupling coefficient ($k^2$) of the raised frame domain or region 134 of the BAW device 100 relative to a similar device without the first raised frame structure or layer 120. This can reduce excitation strength of a raised frame spurious mode. Moreover, the first raised frame layer 120 can be configured to contribute to move the frequency of the raised frame mode relatively far away from the main resonant frequency of the BAW device 100, which can result in little or no Gamma loss.

The second raised frame layer 122 can at least partially overlap the first raised frame layer 120, such as in the active region 130 of the BAW device 100. The second raised frame layer 122 can be positioned over the upper electrode 118. The upper electrode 118 can be positioned between the first raised frame layer 120 and the second raised frame layer 122. The second raised frame layer 122 can extend beyond the active region of the bulk acoustic wave device 100 as shown in FIG. 2, which can be beneficial for manufacturability reasons in certain instances. The second raised frame layer 122 can have a non-gradient portion (e.g., in the non-gradient region 138) and a gradient portion (e.g., in the gradient region 136). The non-gradient portion of the second raised frame layer 122 can be substantially parallel to the piezoelectric layer 116 (e.g., to the upper surface thereof), such as in the non-gradient region 138. The non-gradient portion of the second raised frame layer 122 can have a substantially uniform thickness. The gradient portion of the second raised frame layer 122 can be angled downward and/or tapered, for example, and the upper surface of the gradient portion of the second raised frame layer 122 can form an angle 150 relative to upper surface of the non-gradient portion of the second raised frame layer 122. A first (e.g., outer) part 142 of the gradient portion of the second raised frame layer 122 can have substantially uniform thickness, which can be substantially the same as the thickness of the non-gradient portion thereof, and can be angled downward (e.g., toward the piezoelectric layer 116). A second (e.g., inner) part of the gradient portion of the second raised frame layer 122 can have a decreasing thickness moving along a direction from the raised frame structure toward the main acoustically active region 132 (or middle area). The length of the first (e.g., outer) part 142 of the gradient portion of the second raised frame layer 122 can substantially correspond to the length of the gradient portion of the first raised frame layer 120, in some implementations.

The second raised frame layer 122 can be a relatively high acoustic impedance material. The second raised frame layer 122 can include a relatively high density material. For instance, the second raised frame layer 122 can include molybdenum (Mo), tungsten (W), ruthenium (Ru), platinum (Pt), iridium (Jr), the like, or any suitable alloy thereof. The second raised frame layer 122 can be a metal layer. Alternatively, the second raised frame layer 122 can be a suitable non-metal material with a relatively high density. The density and/or acoustic impedance of the second raised frame layer 122 can be similar to or greater than the density and/or acoustic impedance of the lower electrode 114, of the upper electrode 118, of the piezoelectric layer 116, and/or of the first raised frame layer 120 of the BAW device 100. In some instances, the raised frame structure 20 can be of the same material as the lower electrode 114 and/or the upper electrode 118 of the BAW device 100. In some implementations, the second raised frame layer 122 can be adjacent to the upper electrode 118. The upper electrode 118 can have a substantially uniform thickness, although in some cases it may be angled (e.g., downward or toward the piezoelectric layer 116). The second raised frame layer 122 can be a thickened region of the same material that makes up the upper electrode 118. The upper electrode 118 and the second raised frame layer 122 can be formed by different processing steps, and in some cases the can be a resulting identifiable transition between the upper electrode 118 and the second raised frame layer 122 of the same material, although some implementations may not have an identifiable transition between the upper electrode and the second raised frame layer 122.

The second raised frame layer 122 can increase the height of the BAW device 100 in the raised frame region 134. Accordingly, the BAW device 100 can have a greater height in the raised frame region 134 than in other portions of the active region 130, such as the middle area of the active domain. Forming the second raised frame layer 122 over the upper or second electrode 118 can be relatively easy from a manufacturing perspective. However, in some other embodiments, a second raised frame layer can be included in a different position in the stack of layers in the raised frame domain.

The passivation layer 124 can be positioned over the upper electrode 118 and/or over the second raised frame layer 122. The passivation layer 124 can be a silicon dioxide layer, although any suitable passivation material can be used. The passivation layer 124 can be formed with different thicknesses in different regions of the BAW device 100. For example, as shown in FIG. 2, the passivation layer 52 can thinner in the recessed frame region 140 than in the main acoustically active region 132, or than in other portions such as the raised frame region 134, the gradient portion 136, and/or the non-gradient portion 138. In some cases, the recessed frame region 140 can contribute to achieving the relatively high Q, such as below the resonant frequency. By way of example, the combination of the recessed frame region 140 and the raised frame structure of the BAW device 100 can contribute to achieving the relatively high Q, such as below the resonant frequency. In some embodiments, the recessed frame region 140 can be omitted, such as by using a passivation layer 124 that has a substantially uniform thickness. Also, in some embodiments, the passivation layer 124 can be omitted.

The first raised frame layer 120 can have a thickness 144 that is selected and/or configured to provide a BAW device 100 that has a high Q. The thickness 144 of the raised frame layer 120 can be taken at the non-gradient portion thereof (e.g., in the non-gradient region 138). In some embodiments, the thickness of the first raised frame layer 120 can be selected relative to the thickness of the primary resonant wavelength λ of the BAW device and/or relative to the thickness of the piezoelectric layer 116, the lower electrode 114, and/or the upper electrode 118. The piezoelectric layer 116, the lower electrode 114, and the upper electrode 118 can have a combined thickness 146 (sometimes referenced as combined thickness H). The thicknesses of the layers in FIG. 2 are not necessarily drawn to scale, and in some embodiments, the piezoelectric layer 116 can be significantly thicker than the first and second electrodes 114, 118. For example, the piezoelectric layer 116 can make up more of the combined thickness 146 than what is shown in FIG. 2, although various suitable thicknesses can be used for the piezoelectric layer 116 and the first and second electrodes 114, 118. Acoustic waves can propagate through the piezoelectric layer 116 and the first and second electrodes 114, 118, and a primary resonance can occur for a wave with a wavelength that is about twice the combined thickness 146 of the piezoelectric layer 116 and the first and second electrodes 114, 118. The primary or main resonance frequency of the BAW device can correspond to a resonant wavelength λ that can be double the combined thickness 146 of the piezoelectric layer 116 and the first and second electrodes 114, 118. Accordingly, the resonant wavelength λ can be provided by the equation λ=2H, where H is the combined thickness 146 of the piezoelectric layer 116 and the first and second electrodes 114, 118.

In some embodiments, the thickness 144 of the first raised frame layer 120 can be selected or defined relative to the resonant wavelength λ, or relative to double the combined thickness 146 of the piezoelectric layer 116 and the first and second electrodes 114, 118. For example, in some embodiments, the first raised frame layer 120 can have a thickness 144 of about 0.01 times λ, about 0.02 times λ, about 0.025 times λ, about 0.03 times λ, about 0.035 times λ, about 0.04 times λ, about 0.045 times λ, about 0.05 times λ, about 0.055 times λ, about 0.06 times λ, about 0.065 times λ, about 0.07 times λ, about 0.075 times λ, about 0.08 times λ, about 0.09 times λ, about 0.1 times λ, about 0.125 times λ, about 0.15 times λ, about 0.175 times λ, about 0.2 times λ, or any values therebetween, or any range bounded by any of these values. By way of select examples, the thickness 144 of the first raised frame layer 120 can be between about 0.01λ and about 0.2λ, or between about 0.02λ and about 0.1λ, or between about 0.03λ and about 0.0780 , or between about 0.04λ and about 0.05λ, or the thickness 144 can be about 0.045λ, although other values and ranges can be used. As discussed herein, in some implementations, λ can equal 2H, or two times the combined thickness 146 of the piezoelectric layer 116 and the first and second electrodes 114, 118. In some cases λ can be the main resonant wavelength of the BAW device 100.

In some embodiments, the first raised frame layer 120 can have a thickness 144 of about 0.02 times H, about 0.04 times H, about 0.05 times H, about 0.06 times H, about 0.07 times H, about 0.08 times H, about 0.09 times H, about 0.1 times H, about 0.11 times H, about 0.12 times H, about 0.13 times H, about 0.14 times H, about 0.15 times H, about 0.16 times H, about 0.18 times H, about 0.2 times H, about 0.25 times H, about 0.3 times H, about 0.35 times H, about 0.4 times H, or any values therebetween, or any range bounded by any of these values. By way of select examples, the thickness 144 of the first raised frame layer 120 can be between about 0.02H and about 0.4H, or between about 0.04H and about 0.2H, or between about 0.06H and about 0.14H, or between about 0.08H and about 0.1H, or the thickness 144 can be about 0.09H, although other values and ranges can be used. H can be the combined thickness 146 of the piezoelectric layer 116 and the first and second electrodes 114, 118.

In some embodiments, the electrodes 114, 118 can be configured so that the acoustic wave propagates primarily in the piezoelectric layer 116, so that the thicknesses of the electrodes 114, 118 does not contribute significantly to the main resonant wavelength k of the BAW device 100. For example, the material(s) and/or thicknesses for the piezoelectric layer 116 and/or the first and second electrodes 114, 118 can be selected to impede propagation of the wave in the electrodes 114, 118 while facilitating propagation of the wave in the piezoelectric layer 116. In this configuration, the main resonant wavelength k can be about twice the thickness 148 of the piezoelectric layer 116, without the first and second electrodes 114, 118. The first raised frame layer 120 can have a thickness 144 with the values or ranges discussed above, except that H can be the thickness 148 of the piezoelectric layer 116 (e.g., without the electrodes 114, 118). In some embodiments, the first and second electrodes 114, 118 can be configured differently, so that the acoustic wave propagates primarily in the piezoelectric layer 116 and one of the electrodes 114, 118, while the wave is impeded from propagating in the other of the electrodes 114, 118. The first raised frame layer 120 can have a thickness 144 with the values or ranges discussed above, except that H can be the thickness of the piezoelectric layer 148 and the first electrode 114 (e.g., without the second electrode 118). Also, the first raised frame layer 120 can have a thickness 144 with the values or ranges discussed above, except that H can be the thickness of the piezoelectric layer 148 and the second electrode 118 (e.g., without the second electrode 114).

Figures 3A, 3B, 3C, 3D, 3E, 3F:
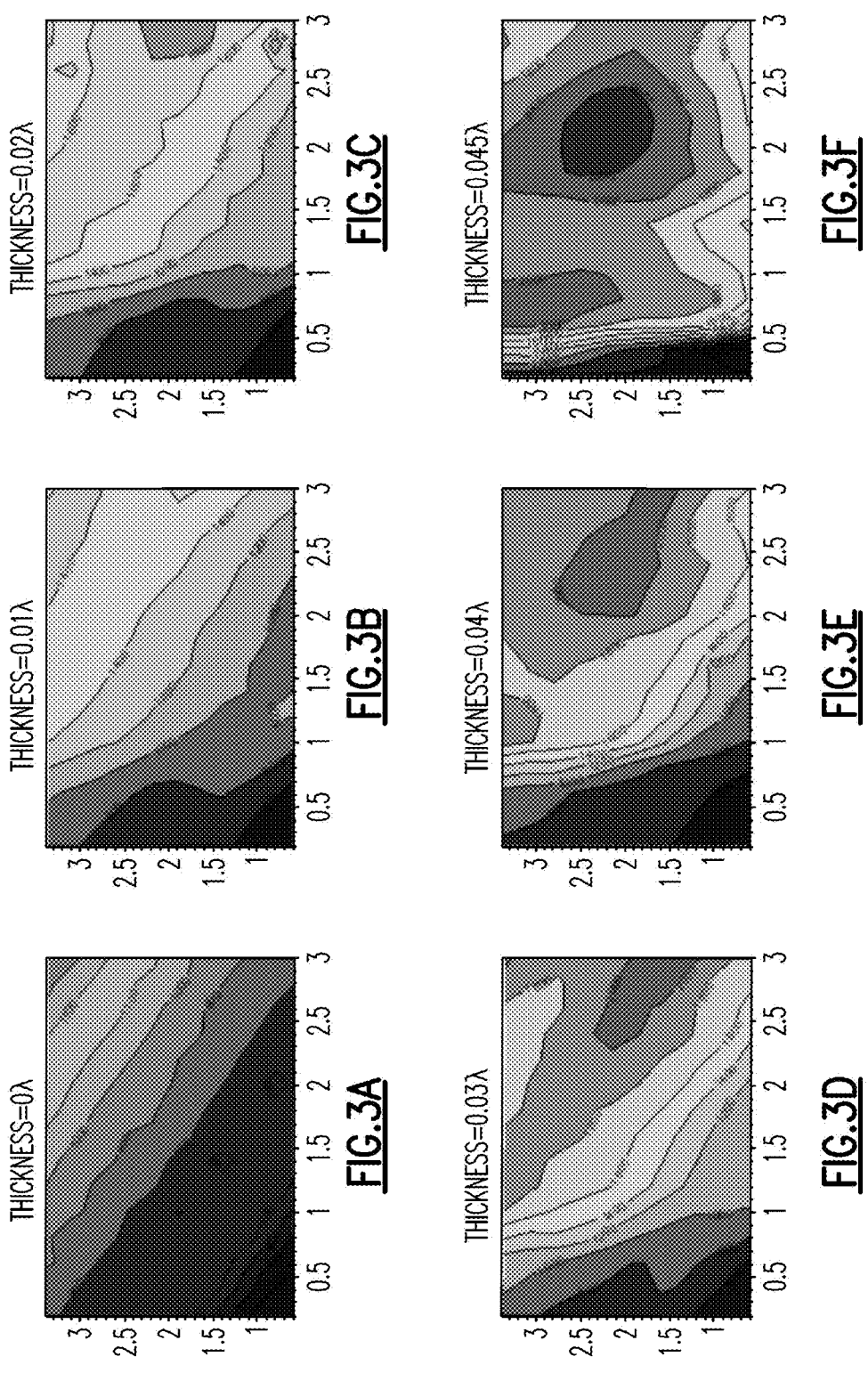
FIGS. 3A-3F are graphs showing quality factor (Q) for example embodiments of raised frame bulk acoustic wave devices.

FIGS. 3A to 3F are graphs showing results of simulated Q values for BAW devices 100 according to the configuration of FIG. 2, with a first raised frame layer thickness 144 of 0λ (e.g., no first raised frame layer 120), 0.01λ, 0.01λ, 0.02λ, 0.03λ, 0.04λ, and 0.045λ, respectively (e.g., 0.0H, 0.02H, 0.04H, 0.06H, 0.08H, and 0.09H, respectively). In FIGS. 3A to 3F, the BAW devices 100 had a combined thickness 146 of 1,660 nm for the piezoelectric layer 116 and the first and second electrodes 114, 118. Using the equation λ=2H, the value for λ in FIGS. 3A to 3F was 3320 nm. In FIGS. 3A to 3F, the X-axis corresponds to the width of the first raised frame layer 120 (e.g., in microns), and the Y-axis corresponds to the width of the second raised frame layer 122 (e.g., in microns). The results shown in FIGS. 3A to 3F indicate that a higher Q can be obtained by increasing the thickness 144 of the first raised frame layer 120 (e.g., from 0.01λ to 0.045λ). For example, FIG. 3B shows results for a BAW device with a first raised frame layer thickness 144 of 0.01λ, and the graph of FIG. 3B shows Q values ranging from about 600 to about 1600. FIG. 3C shows results for a BAW device with a first raised frame layer thickness 144 of 0.02λ, and the graph of FIG. 3B shows Q values ranging from about 600 to about 1800. FIG. 3D shows results for a BAW device with a first raised frame layer thickness 144 of 0.03λ, and the graph of FIG. 3B shows Q values ranging from about 600 to about 2000. FIG. 3E shows results for a BAW device with a first raised frame layer thickness 144 of 0.04λ, and the graph of FIG. 3B shows Q values ranging from about 600 to about 2000. FIG. 3F shows results for a BAW device with a first raised frame layer thickness 144 of 0.045λ, and the graph of FIG. 3B shows Q values ranging from about 600 to about 2200. In some configurations, the Q values can decrease as the thickness of the first raised frame 120 is increased beyond about 0.045λ.

A gradient portion of the raised frame structure can have a angle 150 with respect to a horizontal direction in the illustrated schematic cross-sectional view of FIG. 2. The angle 150 can be with respect to an underlying layer (e.g., a piezoelectric layer). The gradient portion of the first raised frame layer 120 can have an upper surface that is angled (e.g., downward or towards the piezoelectric layer 116 or lower electrode 114) by an angle 150. The gradient angle 150 of the first raised frame layer 120 can affect the layers above the first raised frame layer 120. The upper electrode 118, the second raised frame layer 122, and/or the passivation layer 124 can also have the gradient angle 150. The gradient angle 150 can be less than 90° or less than about 40°, in some embodiments. In some cases, the taper angle can be about 5°, about 10°, about 15°, about 20°, about 30°, about 45°, about 60°, about 75°, or any values therebetween, or any ranges between any of these values. For example, in some instances, the angle 150 can be in a range from about 10° to about 30° for a gradient portion of a raised frame layer in a gradient region, or for other associated layers.

Figure 4:
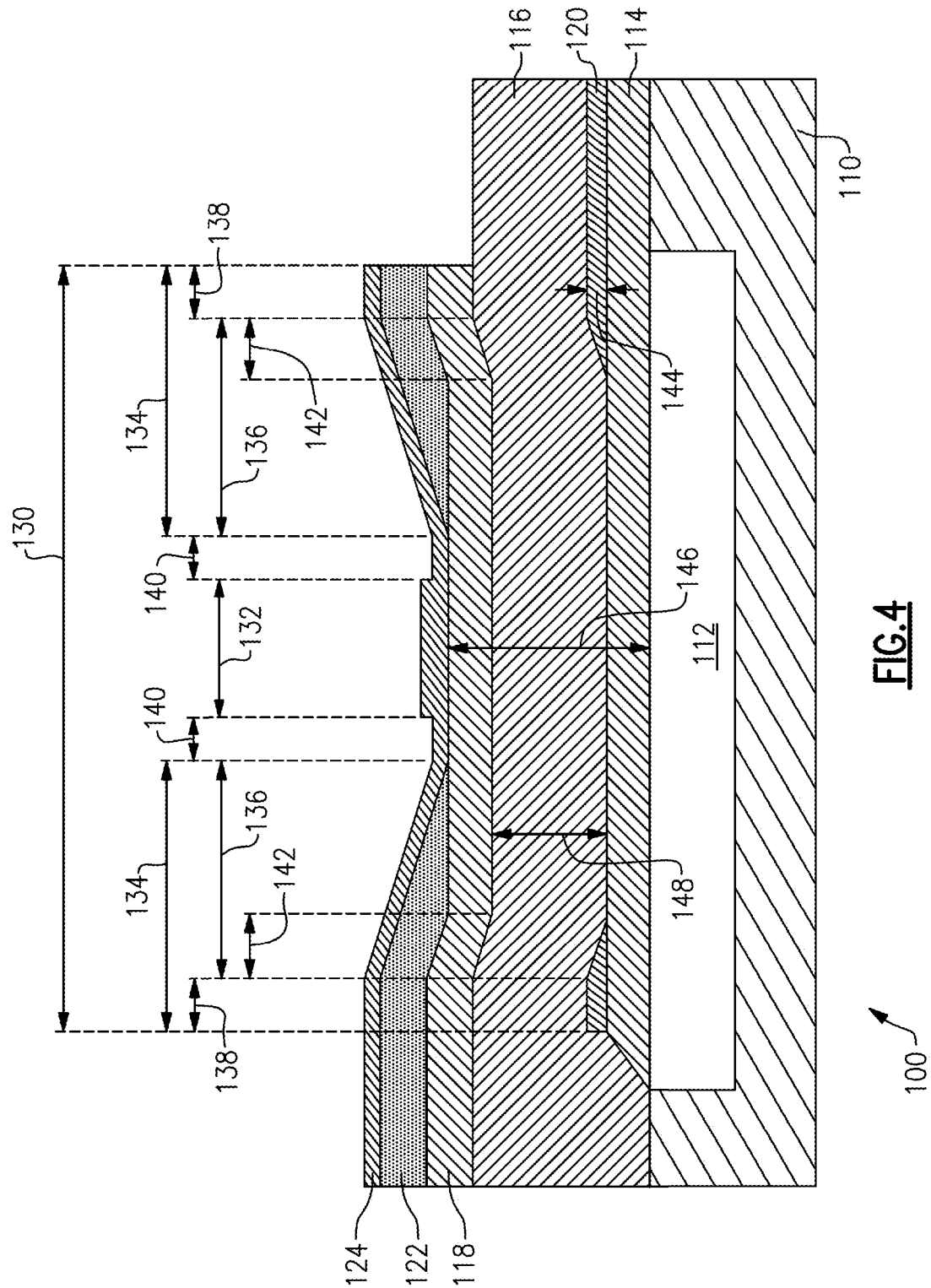
FIG. 4 is a cross-sectional view of another example embodiment of a raised frame bulk acoustic wave device.

FIG. 4 is a cross-sectional view of an example embodiment of a BAW device 100, which can be similar to the BAW device 100 of FIG. 2, except that the first raised frame layer 120 is in a different position. As shown in FIG. 4, the first raised frame layer 120 can be positioned between the first or lower electrode 114 and the piezoelectric layer 116. The first raised frame layer 120 can be in physical contact with the piezoelectric layer 116 and the first electrode 114. The piezoelectric layer 116 in the embodiment of FIG. 4 can have a different shape in cross-sectional view than the piezoelectric layer 16 of FIG. 2. The first raised frame layer 120 in the embodiment of FIG. 4 can have similar features and functionality to the first raised frame layer 120 in the embodiment of FIG. 2. The first raised frame layer 120 in the embodiment of FIG. 4 can have a thickness 144, which can have the same values and ranges as described in connection with FIG. 2. For example, the thickness 144 in FIG. 4 can be selected relative to the resonant wavelength λ and/or the thickness H of the piezoelectric layer 116, the first electrode 114, and/or the second electrode 118, as discussed herein.

Figure 5:
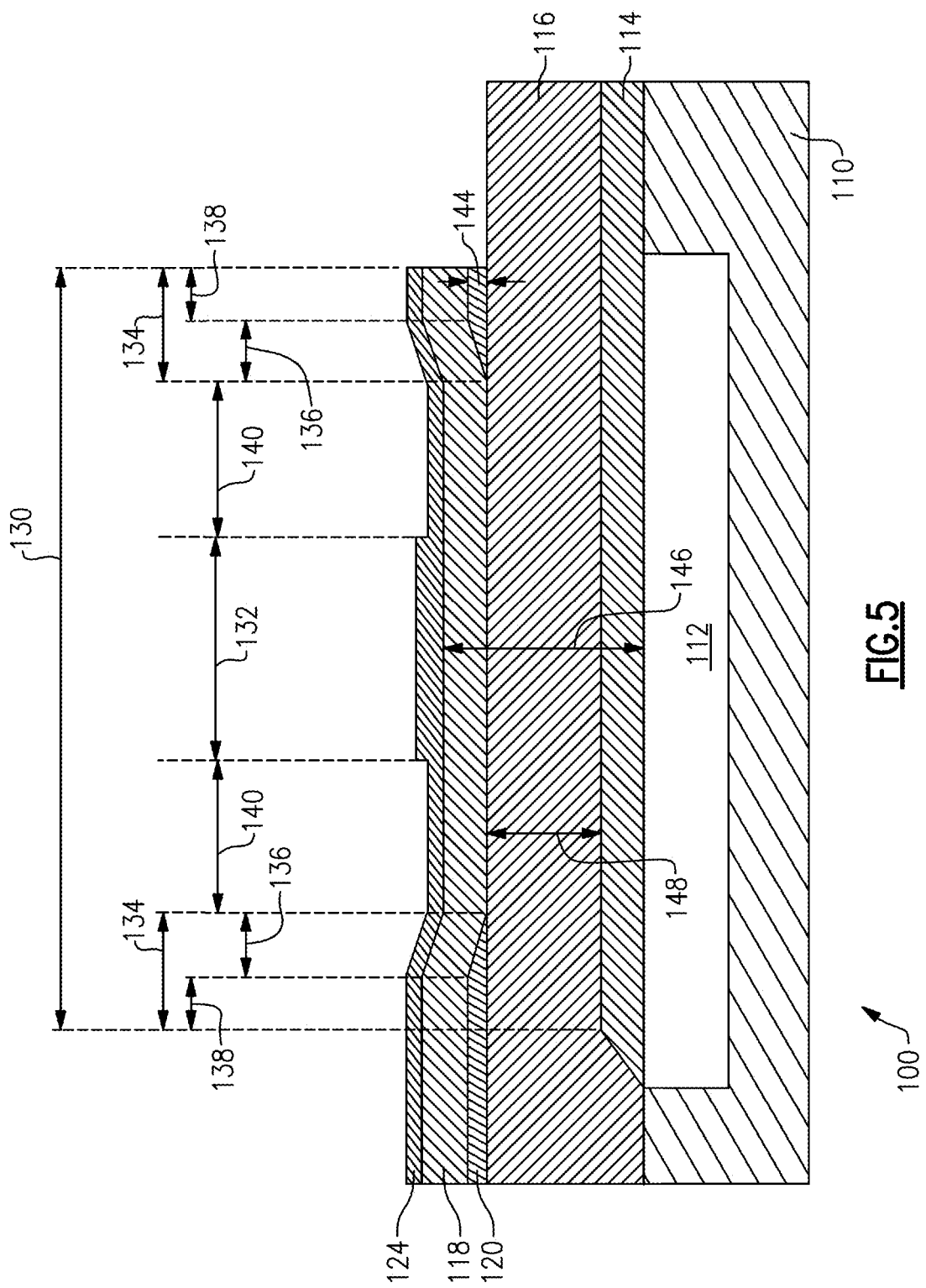
FIG. 5 is a cross-sectional view of another example embodiment of a raised frame bulk acoustic wave device.

FIG. 5 is a cross-sectional view of an example embodiment of a BAW device 100, which can be similar to the BAW device 100 of FIG. 2, except that the second raised frame layer 122 is omitted. In some embodiments, the raised frame structure can be a single layer raised frame structure. The raised frame layer 120 of the embodiment of FIG. 5 can have similar features and functionality to the first raised frame layer 120 in the embodiment of FIG. 2. The raised frame layer 120 in the embodiment of FIG. 5 can have similar features and functionality to the first raised frame layer 120 in the embodiment of FIG. 2. The first raised frame layer 120 in the embodiment of FIG. 5 can have a thickness 144, which can have the same values and ranges as described in connection with FIG. 2. For example, the thickness 144 in FIG. 5 can be selected relative to the resonant wavelength λ and/or the thickness H of the piezoelectric layer 116, the first electrode 114, and/or the second electrode 118, as discussed herein.

Figure 6:
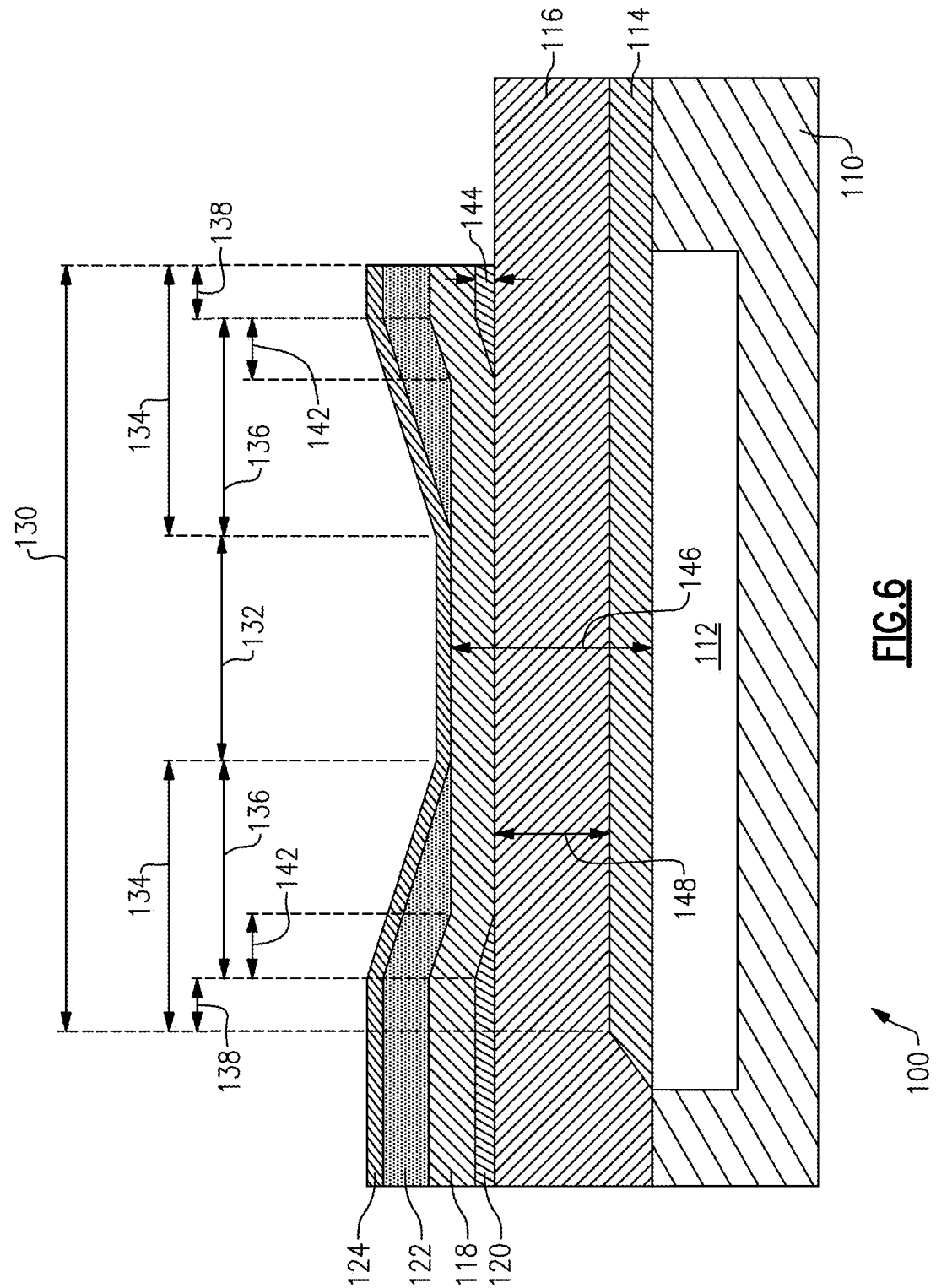
FIG. 6 is a cross-sectional view of another example embodiment of a raised frame bulk acoustic wave device.

FIG. 6 is a cross-sectional view of an example embodiment of a BAW device 100, which can be similar to the BAW device 100 of FIG. 2, except that the recessed frame region 14 is omitted. For example, the passivation layer 124 can have a substantially uniform thickness inside of the raised frame region 134. The raised frame layer structure of the embodiment of FIG. 6 can have similar features and functionality to the raised frame structure in the embodiment of FIG. 2. The raised frame layer 120 in the embodiment of FIG. 6 can have similar features and functionality to the first raised frame layer 120 in the embodiment of FIG. 2. The first raised frame layer 120 in the embodiment of FIG. 6 can have a thickness 144, which can have the same values and ranges as described in connection with FIG. 2. For example, the thickness 144 in FIG. 6 can be selected relative to the resonant wavelength λ and/or the thickness H of the piezoelectric layer 116, the first electrode 114, and/or the second electrode 118, as discussed herein.

Figure 7:
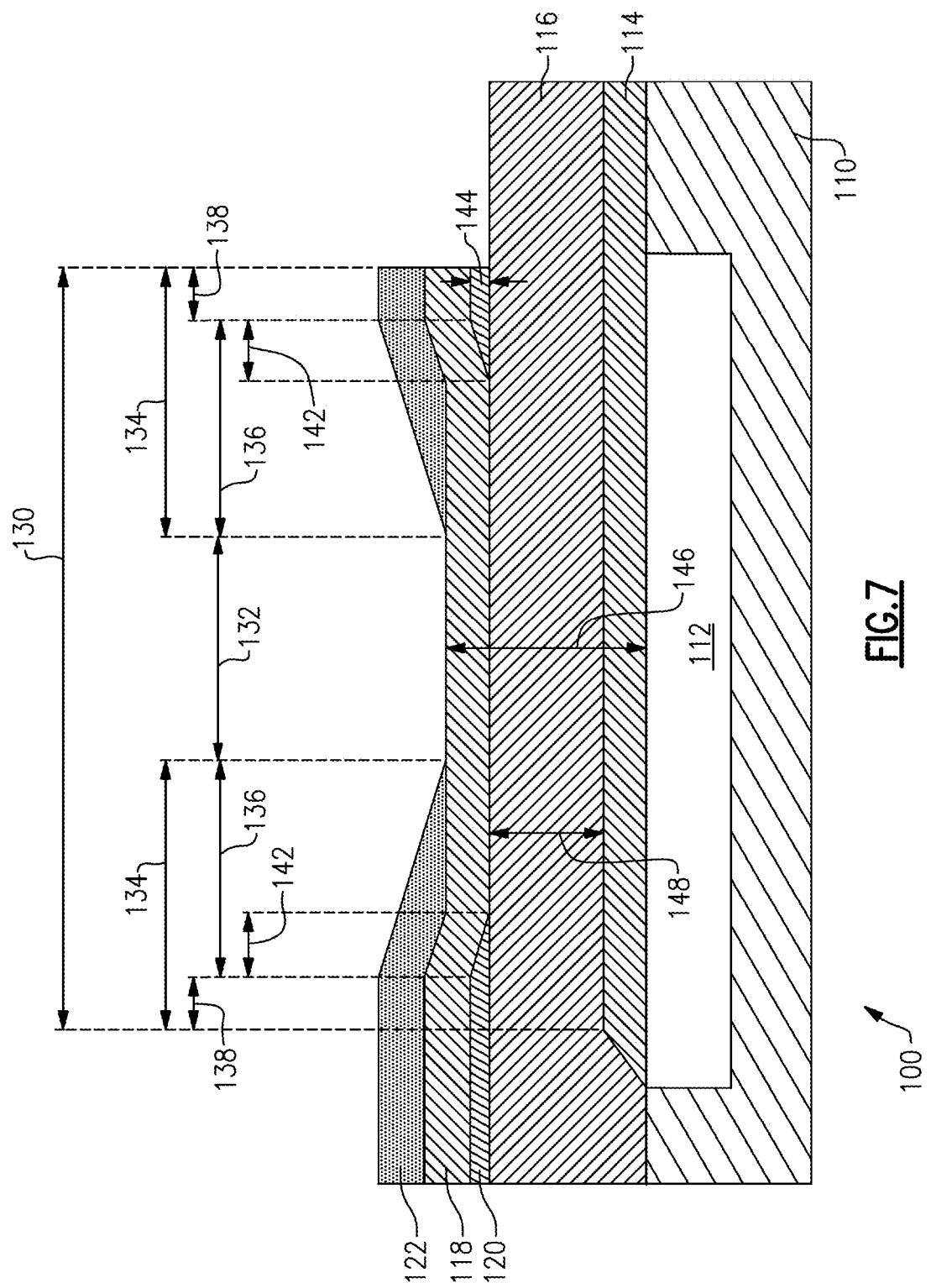
FIG. 7 is a cross-sectional view of another example embodiment of a raised frame bulk acoustic wave device.

FIG. 7 is a cross-sectional view of an example embodiment of a BAW device 100, which can be similar to the BAW device 100 of FIG. 2, except that the passivation layer 124 is omitted. The raised frame layer structure of the embodiment of FIG. 7 can have similar features and functionality to the raised frame structure in the embodiment of FIG. 2. The raised frame layer 120 in the embodiment of FIG. 7 can have similar features and functionality to the first raised frame layer 120 in the embodiment of FIG. 2. The first raised frame layer 120 in the embodiment of FIG. 7 can have a thickness 144, which can have the same values and ranges as described in connection with FIG. 2. For example, the thickness 144 in FIG. 7 can be selected relative to the resonant wavelength λ and/or the thickness H of the piezoelectric layer 116, the first electrode 114, and/or the second electrode 118, as discussed herein.

The BAW device 100 can be a film bulk acoustic wave resonator (FBAR), as illustrated in FIGS. 2 and 4-7. A cavity 112 can be included, such as below the first electrode 114. The cavity 112 can be filled with air, in some implementations. The cavity 112 can be defined by the geometry of the first electrode 114 and the substrate 110. Although the BAW devices 100 illustrated in FIGS. 2 and 4-7 are FBAR devices, any suitable principles and advantages discussed herein can be applied to a solidly mounted resonator (SMR).

Figure 8:
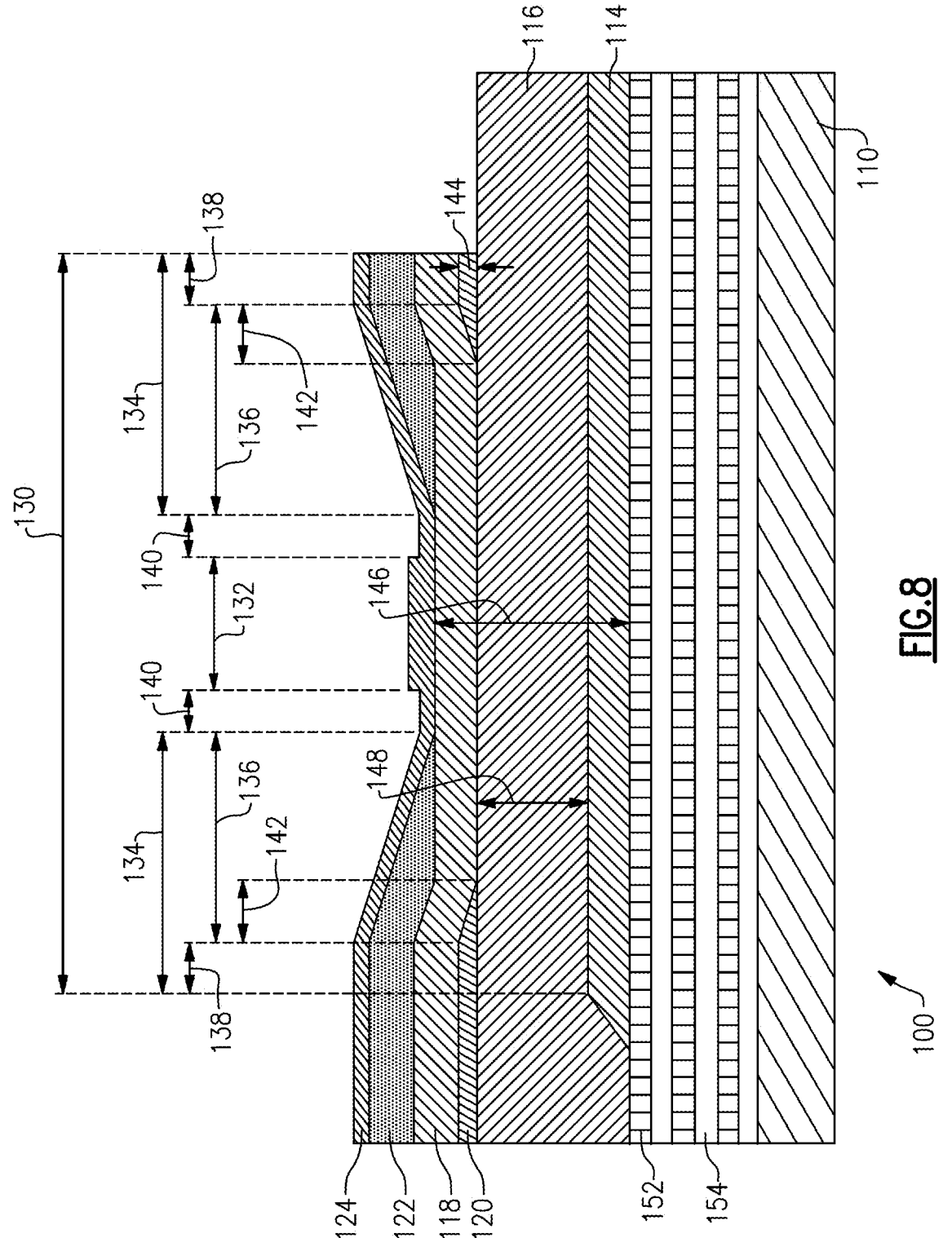
FIG. 8 is a cross-sectional view of another example embodiment of a raised frame bulk acoustic wave device.

FIG. 8 is a cross-sectional view of an example embodiment of a BAW device 100, which can be similar to the BAW device 100 of FIG. 2, except that the BAW device 100 is an SMR instead of an FBAR. In the BAW device 100 of FIG. 8, a solid acoustic mirror can be disposed between the first electrode 114 and a silicon substrate 110. The illustrated acoustic mirror includes acoustic Bragg reflectors. The illustrated acoustic Bragg reflectors include alternating low impedance layers 152 and high impedance layers 154. As an example, the Bragg reflectors can include alternating silicon dioxide layers as low impedance layers 152 and tungsten layers as high impedance layers 154, although other suitable materials could be used. The raised frame layer structure of the embodiment of FIG. 8 can have similar features and functionality to the raised frame structure in the embodiment of FIG. 2. The raised frame layer 120 in the embodiment of FIG. 8 can have similar features and functionality to the first raised frame layer 120 in the embodiment of FIG. 2. The first raised frame layer 120 in the embodiment of FIG. 8 can have a thickness 144, which can have the same values and ranges as described in connection with FIG. 2. For example, the thickness 144 in FIG. 8 can be selected relative to the resonant wavelength λ and/or the thickness H of the piezoelectric layer 116, the first electrode 114, and/or the second electrode 118, as discussed herein.

The various features of the BAW devices 100 of FIGS. 2 and 4-8 can be combined. For example, any of the BAW devices of FIGS. 2 and 4-7 can be an SMR instead of an FBAR (e.g., as shown in FIG. 8). Any of the BAW devices of FIGS. 2 and 5-8 can have the first raised frame layer 120 disposed between the lower electrode 114 and the piezoelectric layer 116 (e.g., as shown in FIG. 4). Any of the BAW devices of FIGS. 2, 4, and 6-8 can omit the second raised frame layer 122 (e.g., as shown in FIG. 5). Any of the BAW devices of FIGS. 2, 4-5, and 8 can omit the recessed frame region 140 (e.g., as shown FIG. 6) or can omit the passivation layer 124 (e.g., as shown in FIG. 7). A BAW device 100 can include any combination of these features.

The BAW resonators disclosed herein can be implemented in acoustic wave filters. In certain applications, the acoustic wave filters can be band pass filters arranged to pass a radio frequency band and attenuate frequencies outside of the radio frequency band. Two or more acoustic wave filters can be coupled together at a common node and arranged as a multiplexer, such as a duplexer.

Figure 9:
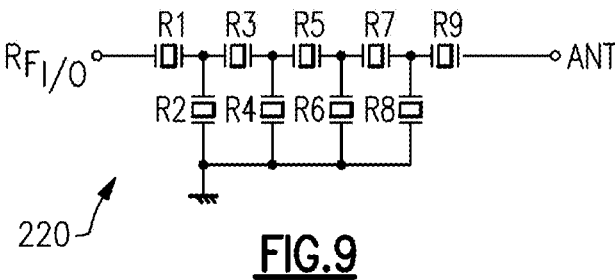
FIG. 9 is a schematic diagram of an example of an acoustic wave ladder filter.

FIG. 9 is a schematic diagram of an example of an acoustic wave ladder filter 220. The acoustic wave ladder filter 220 can be a transmit filter or a receive filter. The acoustic wave ladder filter 220 can be a band pass filter arranged to filter a radio frequency signal. The acoustic wave filter 220 can include series resonators R1, R3, R5, R7, and R9 and shunt resonators R2, R4, R6, and R8 coupled between a radio frequency input/output port RFI/O and an antenna port ANT. The radio frequency input/output port RFI/O can be a transmit port in a transmit filter or a receive port in a receive filter. One or more of the illustrated acoustic wave resonators can be a bulk acoustic wave resonator in accordance with any suitable principles and advantages discussed herein. An acoustic wave ladder filter can include any suitable number of series resonators and any suitable number of shunt resonators.

An acoustic wave filter can be arranged in any other suitable filter topology, such as a lattice topology or a hybrid ladder and lattice topology. A bulk acoustic wave resonator in accordance with any suitable principles and advantages disclosed herein can be implemented in a band pass filter. In some other applications, a bulk acoustic wave resonator in accordance with any suitable principles and advantages disclosed herein can be implemented in a band stop filter.

Figure 10:
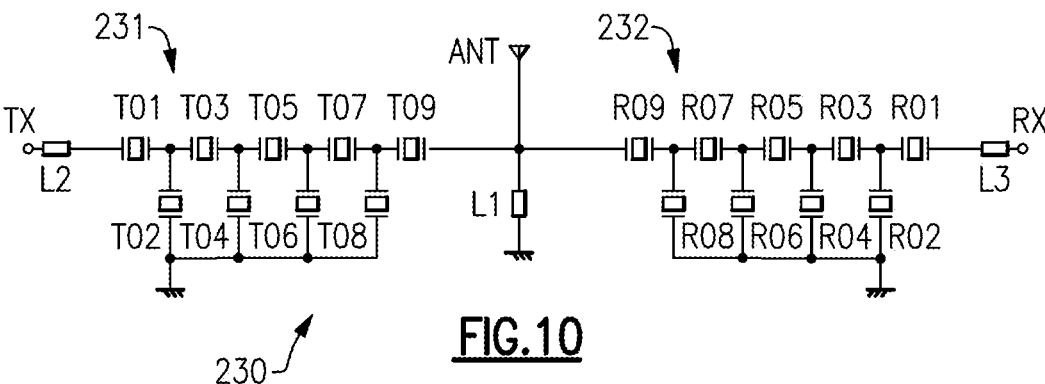
FIG. 10 is a schematic diagram of an example of a duplexer.

FIG. 10 is a schematic diagram of an example of a duplexer 230. The duplexer 230 can include a transmit filter 231 and a receive filter 232 coupled to each other at an antenna node ANT. A shunt inductor L1 can be connected to the antenna node ANT. The transmit filter 231 and the receive filter 232 can both be acoustic wave ladder filters in the duplexer 230.

The transmit filter 131 can filter a radio frequency signal and provide a filtered radio frequency signal to the antenna node ANT. A series inductor L2 can be coupled between a transmit input node TX and the acoustic wave resonators of the transmit filter 131. The illustrated transmit filter 131 can include acoustic wave resonators T01 to T09. One or more of these resonators can be bulk acoustic wave resonator in accordance with any suitable principles and advantages disclosed herein. The illustrated receive filter can include acoustic wave resonators R01 to R09. One or more of these resonators can be a bulk acoustic wave resonator in accordance with any suitable principles and advantages disclosed herein. The receive filter can filter a radio frequency signal received at the antenna node ANT. A series inductor L3 can be coupled between the resonator and a receive output node RX. The receive output node RX of the receive filter provides a radio frequency receive signal.

Figure 11:
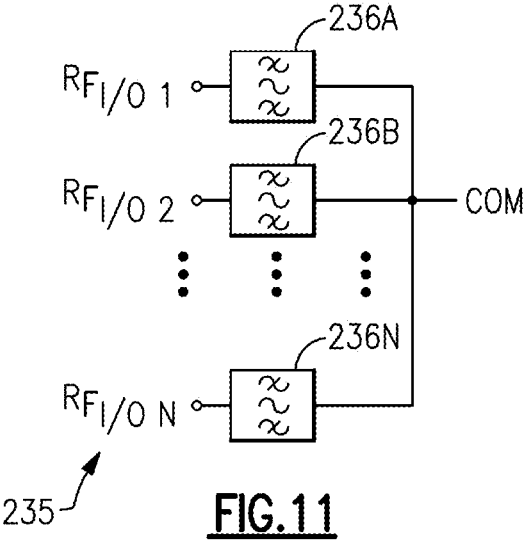
FIG. 11 is a schematic diagram of an example of a multiplexer.

FIG. 11 is a schematic diagram of a multiplexer 235 that includes an acoustic wave filter according to an embodiment. The multiplexer 235 can include a plurality of filters 236A to 236N coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters. Each of the illustrated filters 236A, 236B, and 236N can be coupled between the common node COM and a respective input/output node RFI/O1, RFI/O2, and RFI/ON.

In some instances, all filters of the multiplexer 235 can be receive filters. According to some other instances, all filters of the multiplexer 235 can be transmit filters. In various applications, the multiplexer 235 can include one or more transmit filters and one or more receive filters. Accordingly, the multiplexer 235 can include any suitable number of transmit filters and any suitable number of receive filters. Each of the illustrated filters can be band pass filters having different respective pass bands.

The multiplexer 235 is illustrated with hard multiplexing with the filters 236A to 236N having fixed connections to the common node COM. In some other applications, one or more of the filters of a multiplexer can be electrically connected to the common node by a respective switch. Any of such filters can include a bulk acoustic wave resonator according to any suitable principles and advantages disclosed herein.

A first filter 236A can be an acoustic wave filter having a first pass band and arranged to filter a radio frequency signal. The first filter 236A can include one or more bulk acoustic wave resonators according to any suitable principles and advantages disclosed herein. A second filter 236B has a second pass band. In some embodiments, a raised frame structure of one or more bulk acoustic wave resonators of the first filter 236A can move a raised frame mode of the one or more bulk acoustic wave resonators away from the second passband. This can increase a reflection coefficient (Gamma) of the first filter 236A in the pass band of the second filter

236B. The raised frame structure of the bulk acoustic wave resonator of the first filter 236A can also move the raised frame mode away from the passband of one or more other filters of the multiplexer 235.

In certain instances, the common node COM of the multiplexer 235 can be arranged to receive a carrier aggregation signal including at least a first carrier associated with the first passband of the first filter 236A and a second carrier associated with the second passband of the second filter 236B. A multi-layer raised frame structure of a bulk acoustic wave resonator of the first filter 236A can maintain and/or increase a reflection coefficient of the first filter 236A in the second passband of the second filter 236B that is associated with the second carrier of the carrier aggregation signal.

The filters 236B to 236N of the multiplexer 235 can include one or more acoustic wave filters, one or more acoustic wave filters that include at least one bulk acoustic wave resonator with a raised frame structure, one or more LC filters, one or more hybrid acoustic wave LC filters, or any suitable combination thereof.

The raised frame bulk acoustic wave resonators disclosed herein can be implemented in a variety of packaged modules. Some example packaged modules will now be discussed in which any suitable principles and advantages of the bulk acoustic wave devices disclosed herein can be implemented. The example packaged modules can include a package that encloses the illustrated circuit elements. The illustrated circuit elements can be disposed on a common packaging substrate. The packaging substrate can be a laminate substrate, for example. FIGS. 12, 13A, 13B, and 14 are schematic block diagrams of illustrative packaged modules according to certain embodiments. Certain example packaged modules can include one or more radio frequency amplifiers, such as one or more power amplifiers and/or one or more low noise amplifiers. Any suitable combination of features of these modules can be implemented with each other. While duplexers are illustrated in the example packaged modules of FIGS. 12, 13A, and 14, any other suitable multiplexer that includes a plurality of acoustic wave filters coupled to a common node can be implemented instead of one or more duplexers. For example, a quadplexer can be implemented in certain applications. Alternatively or additionally, one or more filters of a packaged module can be arranged as a transmit filter or a receive filter that is not included in a multiplexer.

FIG. 12 is a schematic block diagram of an example module 240 that includes duplexers 241A to 241N and an antenna switch 242. One or more filters of the duplexers 241A to 241N can include any suitable number of multi-layer raised frame bulk acoustic wave resonators in accordance with any suitable principles and advantages discussed herein. Any suitable number of duplexers 241A to 241N can be implemented. The antenna switch 242 can have a number of throws corresponding to the number of duplexers 241A to 241N. The antenna switch 242 can electrically couple a selected duplexer to an antenna port of the module 240.

FIG. 13A is a schematic block diagram of an example module 250 that includes a power amplifier 252, a radio frequency switch 254, and duplexers 241A to 241N in accordance with one or more embodiments. The power amplifier 252 can amplify a radio frequency signal. The radio frequency switch 254 can be a multi-throw radio frequency switch. The radio frequency switch 254 can electrically couple an output of the power amplifier 252 to a selected transmit filter of the duplexers 241A to 241N. One or more filters of the duplexers 241A to 241N can include any suitable number of raised frame bulk acoustic wave resonators in accordance with any suitable principles and advantages discussed herein. Any suitable number of duplexers 241A to 241N can be implemented.

FIG. 13B is a schematic block diagram of an example module 255 that includes filters 256A to 256N, a radio frequency switch 257, and a low noise amplifier 258 according to one or more embodiments. One or more filters of the filters 256A to 256N can include any suitable number of raised frame bulk acoustic wave resonators in accordance with any suitable principles and advantages disclosed herein. Any suitable number of filters 256A to 256N can be implemented. The illustrated filters 256A to 256N can be receive filters. In some embodiments (not illustrated), one or more of the filters 256A to 256N can be included in a multiplexer that also includes a transmit filter. The radio frequency switch 257 can be a multi-throw radio frequency switch. The radio frequency switch 257 can electrically couple an output of a selected filter of filters 256A to 256N to the low noise amplifier 257. In some embodiments (not illustrated), a plurality of low noise amplifiers can be implemented. The module 255 can include diversity receive features in certain applications.

FIG. 14 is a schematic block diagram of an example module 260 that includes a power amplifier 252, a radio frequency switch 254, and a duplexer 241 that includes a raised frame bulk acoustic wave device in accordance with one or more embodiments, and an antenna switch 242. The module 260 can include elements of the module 240 and elements of the module 250.

Figure 15A:
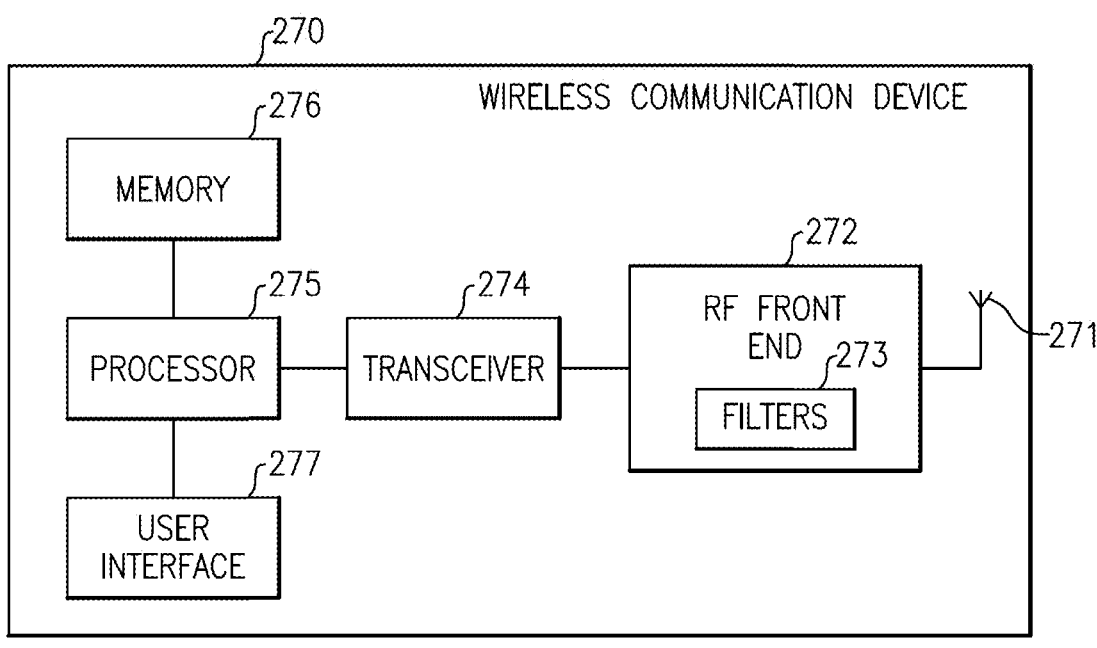
FIG. 15A is a schematic block diagram of a wireless communication device that includes filters that include one or more raised frame bulk acoustic wave devices.

One or more filters with any suitable number of raised frame bulk acoustic devices can be implemented in a variety of wireless communication devices. FIG. 15A is a schematic block diagram of an example wireless communication device 270 that includes a filter 273 with one or more raised frame bulk acoustic wave resonators in accordance with any suitable principles and advantages disclosed herein. The wireless communication device 270 can be any suitable wireless communication device. For instance, a wireless communication device 270 can be a mobile phone, such as a smart phone. As illustrated, the wireless communication device 270 includes an antenna 271, a radio frequency (RF) front end 272 that includes filter 273, an RF transceiver 274, a processor 275, a memory 276, and a user interface 277. The antenna 271 can transmit RF signals provided by the RF front end 272. The antenna 271 can provide received RF signals to the RF front end 272 for processing.

The RF front end 272 can include one or more power amplifiers, one or more low noise amplifiers, RF switches, receive filters, transmit filters, duplex filters, filters of a multiplexer, filters of a diplexers or other frequency multiplexing circuit, or any suitable combination thereof. The RF front end 272 can transmit and receive RF signals associated with any suitable communication standards. Any of the multi-layer raised frame bulk acoustic wave resonators disclosed herein can be implemented in filters 273 of the RF front end 272.

The RF transceiver 274 can provide RF signals to the RF front end 272 for amplification and/or other processing. The RF transceiver 274 can also process an RF signal provided by a low noise amplifier of the RF front end 272. The RF transceiver 274 is in communication with the processor 275. The processor 275 can be a baseband processor. The processor 275 can provide any suitable base band processing functions for the wireless communication device 270. The memory 276 can be accessed by the processor 275. The memory 276 can store any suitable data for the wireless communication device 270. The processor 275 is also in communication with the user interface 277. The user interface 277 can be any suitable user interface, such as a display.

Figure 15B:
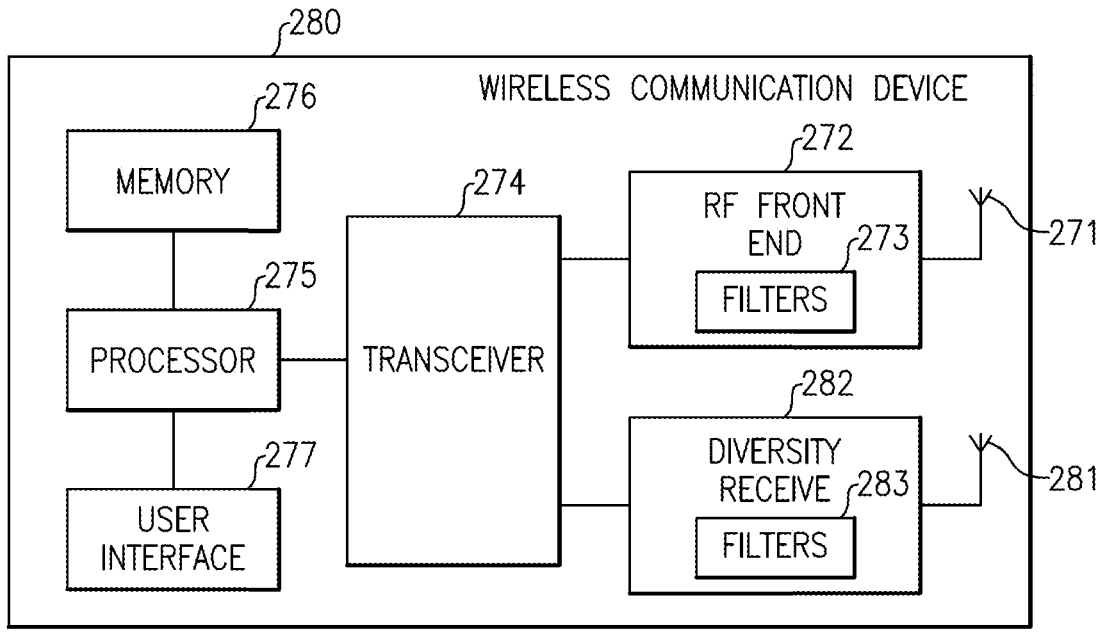
FIG. 15B is a schematic block diagram of another wireless communication device that includes filters that include one or more raised frame bulk acoustic wave devices.

FIG. 15B is a schematic diagram of a wireless communication device 280 that includes filters 273 in a radio frequency front end 272 and second filters 283 in a diversity receive module 282. The wireless communication device 280 is like the wireless communication device 270 of FIG. 15A, except that the wireless communication device 280 also includes diversity receive features. As illustrated in FIG. 15B, the wireless communication device 280 can include a diversity antenna 281, a diversity module 282 configured to process signals received by the diversity antenna 281 and including filters 283, and a transceiver 274 in communication with both the radio frequency front end 272 and the diversity receive module 282. One or more of the second filters 283 can include a bulk acoustic wave resonator with a multi-layer raised frame structure in accordance with any suitable principles and advantages disclosed herein.

Bulk acoustic wave devices disclosed herein can be included in a filter and/or a multiplexer arranged to filter a radio frequency signal in a fifth generation (5G) New Radio (NR) operating band within Frequency Range 1 (FR1). FR1 can from 410 megahertz (MHz) to 7.125 gigahertz (GHz), for example, as specified in a current 5G NR specification. A filter arranged to filter a radio frequency signal in a 5G NR FR1 operating band can include one or more bulk acoustic wave resonators be implemented in accordance with any suitable principles and advantages disclosed herein.

5G NR carrier aggregation specifications can present technical challenges. For example, 5G carrier aggregations can have wider bandwidth and/or channel spacing than fourth generation (4G) Long Term Evolution (LTE) carrier aggregations. Carrier aggregation bandwidth in certain 5G FR1 applications can be in a range from 120 MHz to 400 MHz, such as in a range from 120 MHz to 200 MHz. Carrier spacing in certain 5G FR1 applications can be up to 100 MHz. Bulk acoustic wave resonators with a raised frame structure as disclosed herein can achieve low insertion loss and low Gamma loss, in some embodiments. The frequency of a raised frame mode of such a bulk acoustic wave resonator can be moved significantly away from a resonant frequency of the bulk acoustic wave resonator. Accordingly, the raised frame mode can be outside of a carrier aggregation band even with the wider carrier aggregation bandwidth and/or channel spacing within FR1 in 5G specifications. This can reduce and/or eliminate Gamma degradation in an operating band of another carrier of a carrier aggregation. In some instances, Gamma can be increased in the operating band of the other carrier of the carrier aggregation.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, devices, modules, apparatus, methods, and systems described herein may be embodied in a variety of other forms. Furthermore, various omissions, substitutions and changes in the form of the resonators, devices, modules, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

The following is claimed:

1. A bulk acoustic wave device comprising:
a first electrode;
a second electrode;
a piezoelectric layer between the first electrode and the second electrode, the first electrode, the second electrode, and the piezoelectric layer having a combined thickness H; and a raised frame structure including a first raised frame layer below a second raised frame layer, the first and second raised frame layers partially extend into an active region of the piezoelectric layer, the first raised frame layer having a first non-gradient region and a first gradient region, the first non-gradient region having a thickness between about 0.02 to about 0.4 times the combined thickness H, the second raised frame layer having a higher acoustic impedance than the first raised frame layer, the second raised frame layer having a second non-gradient region and second gradient region with the second gradient region extending further into the active region than the first gradient region of the first raised frame layer.

2. The bulk acoustic wave device of claim 1, wherein the thickness of the first non-gradient region of first raised frame layer is between about 0.04 to about 0.2 times the combined thickness H.

3. The bulk acoustic wave device of claim 1, wherein the thickness of the first non-gradient region of first raised frame layer is between about 0.08 to about 0.1 times the combined thickness H.

4. The bulk acoustic wave device of claim 1, wherein the active region includes a middle area, and the raised frame structure positioned outside the middle area of the active region, and the combined thickness H being at the middle area of the active region.

5. The bulk acoustic wave device of claim 4, comprising a recessed frame region between the raised frame structure and the middle area.

6. The bulk acoustic wave device of claim 5, further comprising a passivation layer over the first electrode, the second electrode, the piezoelectric layer, and the raised frame structure, the passivation layer thinner at the recessed frame region than at the middle area.

7. The bulk acoustic wave device of claim 1, wherein the first non-gradient region of the first raised frame layer partially extends below the first second non-gradient region of the second raised frame layer.

8. The bulk acoustic wave device of claim 1, wherein the first raised frame layer is between the first electrode and the second electrode, the piezoelectric layer is over the first electrode, the second electrode is over the piezoelectric layer, and the first raised frame layer is between the second electrode and the piezoelectric layer.

9. The bulk acoustic wave device of claim 8, wherein the second raised frame layer is over the second electrode.

10. The bulk acoustic wave device of claim 1, wherein the first raised frame layer is between the first electrode and the second electrode, the piezoelectric layer is over the first electrode, the second electrode is over the piezoelectric layer, and the first raised frame layer is between the first electrode and the piezoelectric layer.

11. The bulk acoustic wave device of claim 10, wherein the second raised frame layer is over the second electrode.

12. The bulk acoustic wave device of claim 1, wherein the first raised frame layer includes silicon dioxide.

13. The bulk acoustic wave device of claim 1, wherein the second raised frame layer includes the same material as the second electrode.

14. The bulk acoustic wave device of claim 1, wherein the second raised frame layer includes at least one of molybdenum, tungsten, ruthenium, platinum, or iridium.

15. A bulk acoustic wave device comprising:

a first electrode;

a second electrode;

a piezoelectric layer between the first electrode and the second electrode, the first electrode, the second electrode, and the piezoelectric layer having a combined thickness H; and a raised frame structure including a first raised frame layer below a second raised frame layer, the first and second raised frame layers partially extend into an active area of the piezoelectric layer, the first raised frame layer having a lower acoustic impedance than at least one of the first electrode, the second electrode, and the piezoelectric layer, and the first raised frame layer having a first gradient region and a first non-gradient region, with a thickness of the first non-gradient region between about 0.02 to about 0.4 times the combined thickness H, the second raised frame layer having a second non-gradient region and second gradient region with the second gradient region extending further into the active area than the first gradient region of the first raised frame layer.

16. The bulk acoustic wave device of claim 15, wherein the thickness of the first raised frame layer is between about 0.04 to about 0.2 times the combined thickness H.

17. The bulk acoustic wave device of claim 15, wherein the thickness of the first raised frame layer is between about 0.08 to about 0.1 times the combined thickness H.

18. The bulk acoustic wave device of claim 15, wherein the first raised frame layer is between the first electrode and the second electrode.

19. The bulk acoustic wave device of claim 18, wherein the piezoelectric layer is over the first electrode, the second electrode is over the piezoelectric layer, and the first raised frame layer is between the second electrode and the piezoelectric layer.

20. The bulk acoustic wave device of claim 18 wherein the piezoelectric layer is over the first electrode, the second electrode is over the piezoelectric layer, and the first raised frame layer is between the first electrode and the piezoelectric layer.

21. The bulk acoustic wave device of claim 15, wherein the first raised frame layer has a lower acoustic impedance than the first electrode.

22. The bulk acoustic wave device of claim 15, wherein the first raised frame layer has a lower acoustic impedance than the second electrode.

23. The bulk acoustic wave device of claim 15, wherein the first raised frame layer has a lower acoustic impedance than the piezoelectric layer.

24. The bulk acoustic wave device of claim 15, wherein the second raised frame layer has a higher acoustic impedance than the first raised frame layer.

* * * * *